(12) United States Patent
Sharma

(10) Patent No.: US 11,848,060 B2
(45) Date of Patent: *Dec. 19, 2023

(54) MEMORY DEVICES WITH DYNAMIC PROGRAM VERIFY LEVELS

(71) Applicant: MICRON TECHNOLOGY, INC., Boise, ID (US)

(72) Inventor: Ankit Sharma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/107,200

(22) Filed: Feb. 8, 2023

(65) Prior Publication Data

US 2023/0187001 A1 Jun. 15, 2023

Related U.S. Application Data

(63) Continuation of application No. 17/363,079, filed on Jun. 30, 2021, now Pat. No. 11,600,345.

(60) Provisional application No. 63/131,823, filed on Dec. 30, 2020.

(51) Int. Cl.
*G11C 16/04* (2006.01)
*G11C 16/34* (2006.01)
*G11C 16/10* (2006.01)
*G11C 11/56* (2006.01)

(52) U.S. Cl.
CPC ...... *G11C 16/3459* (2013.01); *G11C 16/0483* (2013.01); *G11C 16/10* (2013.01); *G11C 11/5628* (2013.01); *G11C 11/5671* (2013.01)

(58) Field of Classification Search
CPC . G11C 16/3459; G11C 16/0483; G11C 16/10; G11C 11/5628; G11C 11/5671; G11C 16/24; G11C 16/3404
USPC .................................................. 365/185.03
See application file for complete search history.

(56) References Cited

U.S. PATENT DOCUMENTS

| 9,373,390 | B1 * | 6/2016 | Lee ................... G11C 16/3459 |
| 11,600,345 | B2 * | 3/2023 | Sharma .............. G11C 16/0483 |
| 2008/0239806 | A1 | 10/2008 | Moschiano et al. |
| 2020/0273523 | A1 | 8/2020 | Donati et al. |

* cited by examiner

*Primary Examiner* — Tha-O H Bui
(74) *Attorney, Agent, or Firm* — Dicke, Billig & Czaja, PLLC

(57) ABSTRACT

Memory devices might include an array of memory cells and a controller configured to access the array of memory cells. The controller may sense a first threshold voltage of the selected memory cell. In response to the sensed first threshold voltage being between a first pre-program verify level and a first program verify level, the controller may bias the selected memory cell to a first voltage level. The first pre-program verify level might be less than a final pre-program verify level and the first program verify level might be less than a final program verify level.

20 Claims, 16 Drawing Sheets

MEMORY DEVICES WITH DYNAMIC PROGRAM VERIFY LEVELS

RELATED APPLICATIONS

This Application is a Continuation of U.S. application Ser. No. 17/363,079, titled "MEMORY DEVICES WITH DYNAMIC PROGRAM VERIFY LEVELS," filed Jun. 30, 2021 issued as U.S. Pat. No. 11,600,345 on Mar. 7, 2023 which is commonly assigned and incorporated herein by reference in its entirety and which claims the benefit of U.S. Provisional Application No. 63/131,823, filed on Dec. 30, 2020, hereby incorporated herein in its entirety by reference.

TECHNICAL FIELD

The present disclosure relates generally to memory and, in particular, in one or more embodiments, the present disclosure relates to dynamic pre-program verify and program verify levels within memory devices.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells may generally be programmed as what are often termed single-level cells (SLC) or multiple-level cells (MLC). SLC may use a single memory cell to represent one digit (e.g., bit) of data. For example, in SLC, a Vt of 2.5V might indicate a programmed memory cell (e.g., representing a logical 0) while a Vt of −0.5V might indicate an erased cell (e.g., representing a logical 1). As an example, the erased state in SLC might be represented by any threshold voltage less than or equal to 0V, while the programmed data state might be represented by any threshold voltage greater than 0V.

MLC uses more than two Vt ranges, where each Vt range indicates a different data state. As is generally known, a margin (e.g., a certain number of volts), such as a dead space, may separate adjacent Vt ranges, e.g., to facilitate differentiating between data states. Multiple-level cells can take advantage of the analog nature of traditional non-volatile memory cells by assigning a bit pattern to a specific Vt range. While MLC typically uses a memory cell to represent one data state of a binary number of data states (e.g., 4, 8, 16, . . . ), a memory cell operated as MLC may be used to represent a non-binary number of data states. For example, where the MLC uses three Vt ranges, two memory cells might be used to collectively represent one of eight data states.

In programming MLC memory, data values are often programmed using more than one pass, e.g., programming one or more digits in each pass. For example, in four-level MLC (typically referred to simply as MLC), a first digit, e.g., a least significant bit (LSB), often referred to as lower page (LP) data, may be programmed to the memory cells in a first pass, thus resulting in two (e.g., first and second) threshold voltage ranges. Subsequently, a second digit, e.g., a most significant bit (MSB), often referred to as upper page (UP) data may be programmed to the memory cells in a second pass, typically moving some portion of those memory cells in the first threshold voltage range into a third threshold voltage range, and moving some portion of those memory cells in the second threshold voltage range into a fourth threshold voltage range. Similarly, eight-level MLC (typically referred to as TLC) may represent a bit pattern of three bits, including a first digit, e.g., a least significant bit (LSB) or lower page (LP) data; a second digit, e.g., upper page (UP) data; and a third digit, e.g., a most significant bit (MSB) or extra page (XP) data. In operating TLC, the LP data may be programmed to the memory cells in a first pass, resulting in two threshold voltage ranges, followed by the UP data and the XP data in a second pass, resulting in eight threshold voltage ranges. Similarly, sixteen-level MLC (typically referred to as QLC) may represent a bit pattern of four bits, and 32-level MLC (typically referred to as PLC) may represent a bit pattern of five bits.

A read window, which may be referred to as a read window width, refers to a distance (e.g., in voltage) between adjacent Vt distributions at a particular bit error rate (BER). A read window budget (RWB) may refer to a cumulative value of read windows for a group of programmed cells (e.g., one or more pages of cells). For example, TLC memory cells configured to store three bits of data per cell may be programmed to one of eight different Vt distributions, each corresponding to a respective data state. In this example, the RWB may be the cumulative value (e.g., in voltage) of the seven read windows between the eight Vt distributions.

DETAILED DESCRIPTION

Figure 1:
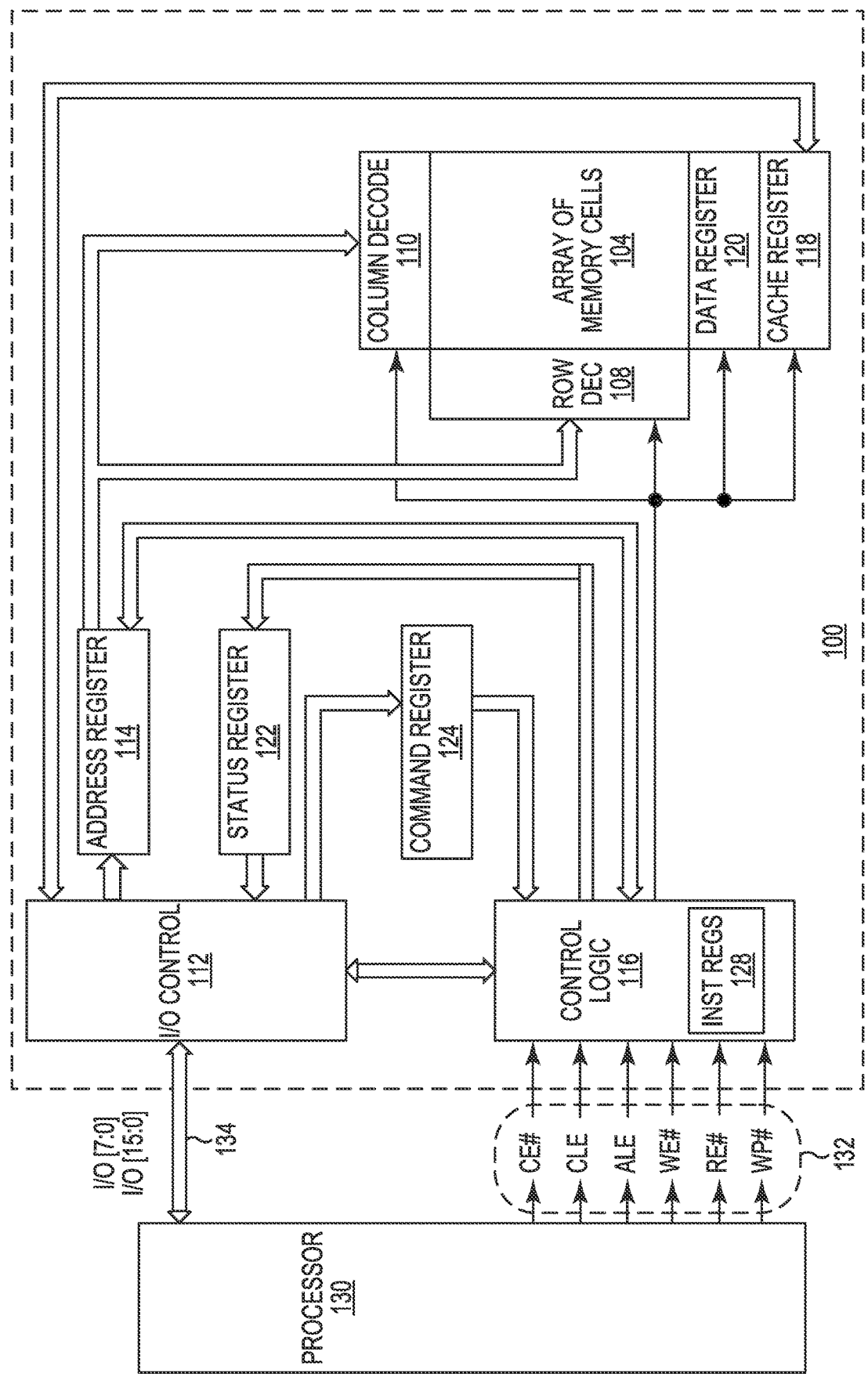
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and may generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
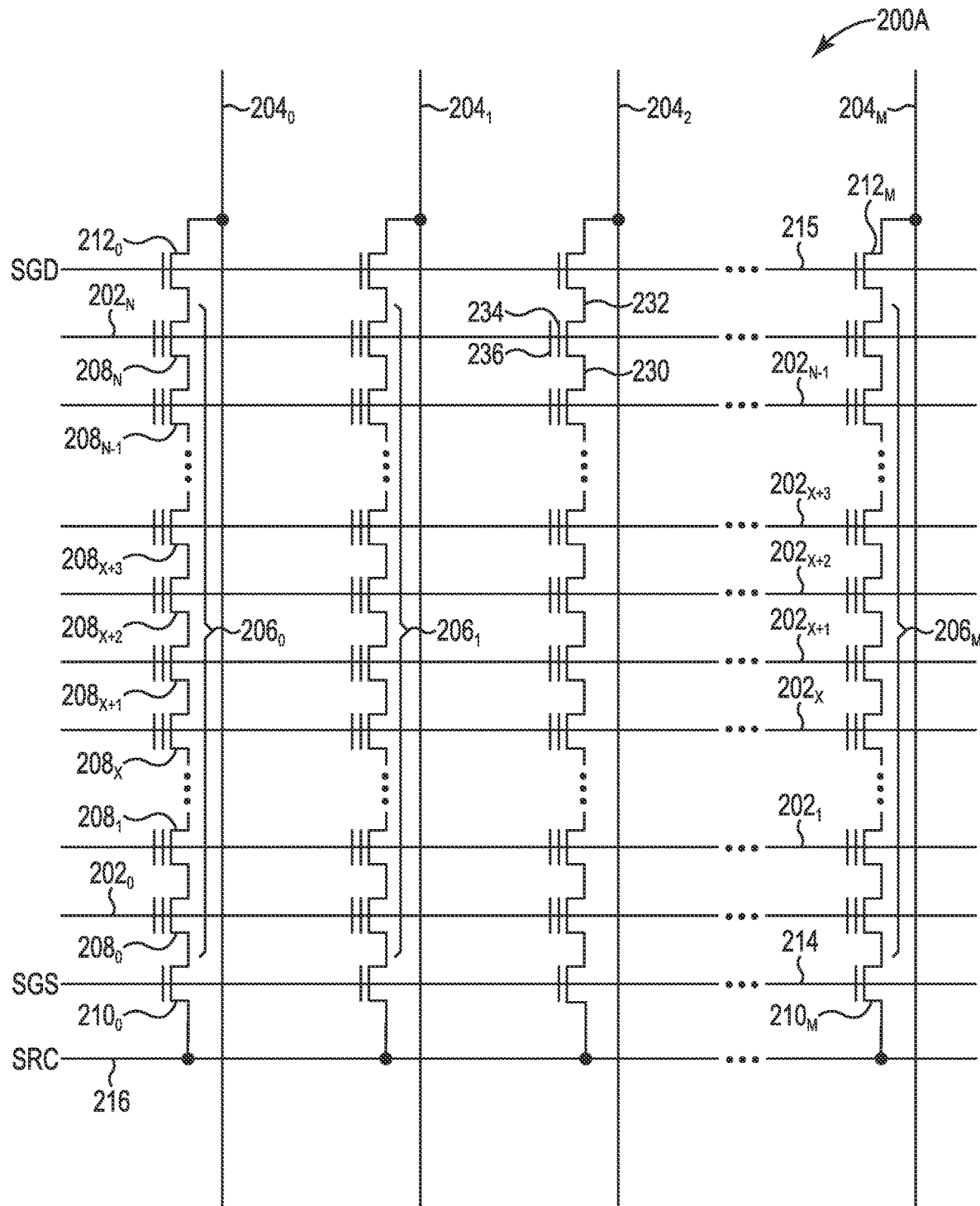
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines (e.g., word lines) $202_0$ to $202_N$, and data lines (e.g., bit lines) $204_0$ to $204_M$. The access lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $202_N$ and selectively connected to even data lines 204 (e.g., data lines $204_0$, $204_2$, $204_4$, etc.) might be one physical page of memory cells 208 (e.g., even memory cells) while memory cells 208 commonly connected to access line $202_N$ and selectively connected to odd data lines 204 (e.g., data lines $204_1$, $204_3$, $204_5$, etc.) might be another physical page of memory cells 208 (e.g., odd memory cells). Although data lines $204_3$-$204_5$ are not explicitly depicted in FIG. 2A, it is apparent from the figure that the data lines 204 of the array of memory cells 200A might be numbered consecutively from data line $204_0$ to data line $204_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $202_0$-$202_N$ (e.g., all NAND strings 206 sharing common access lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
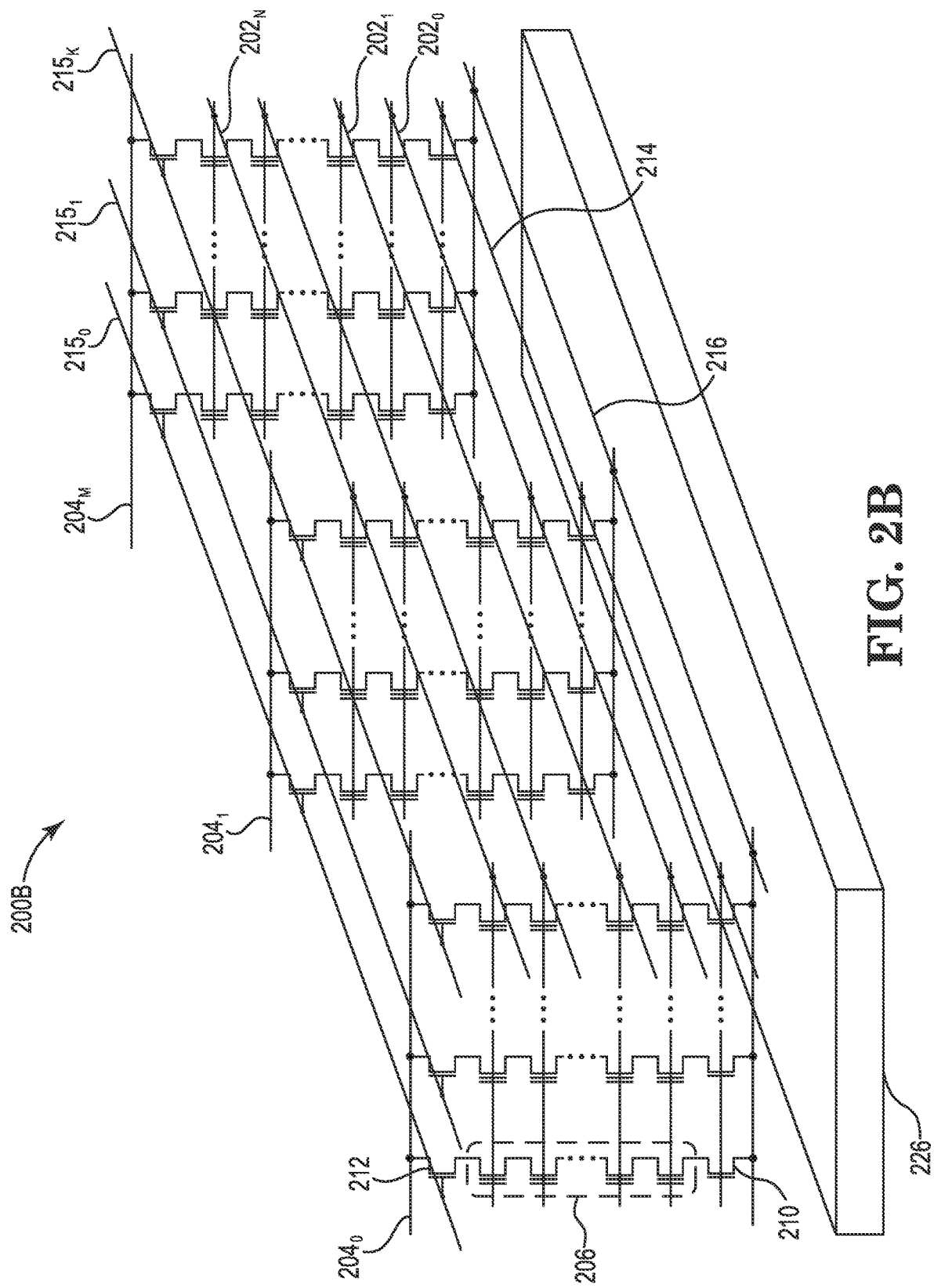

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a data line $204_0$ to $204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $215_0$ to $215_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
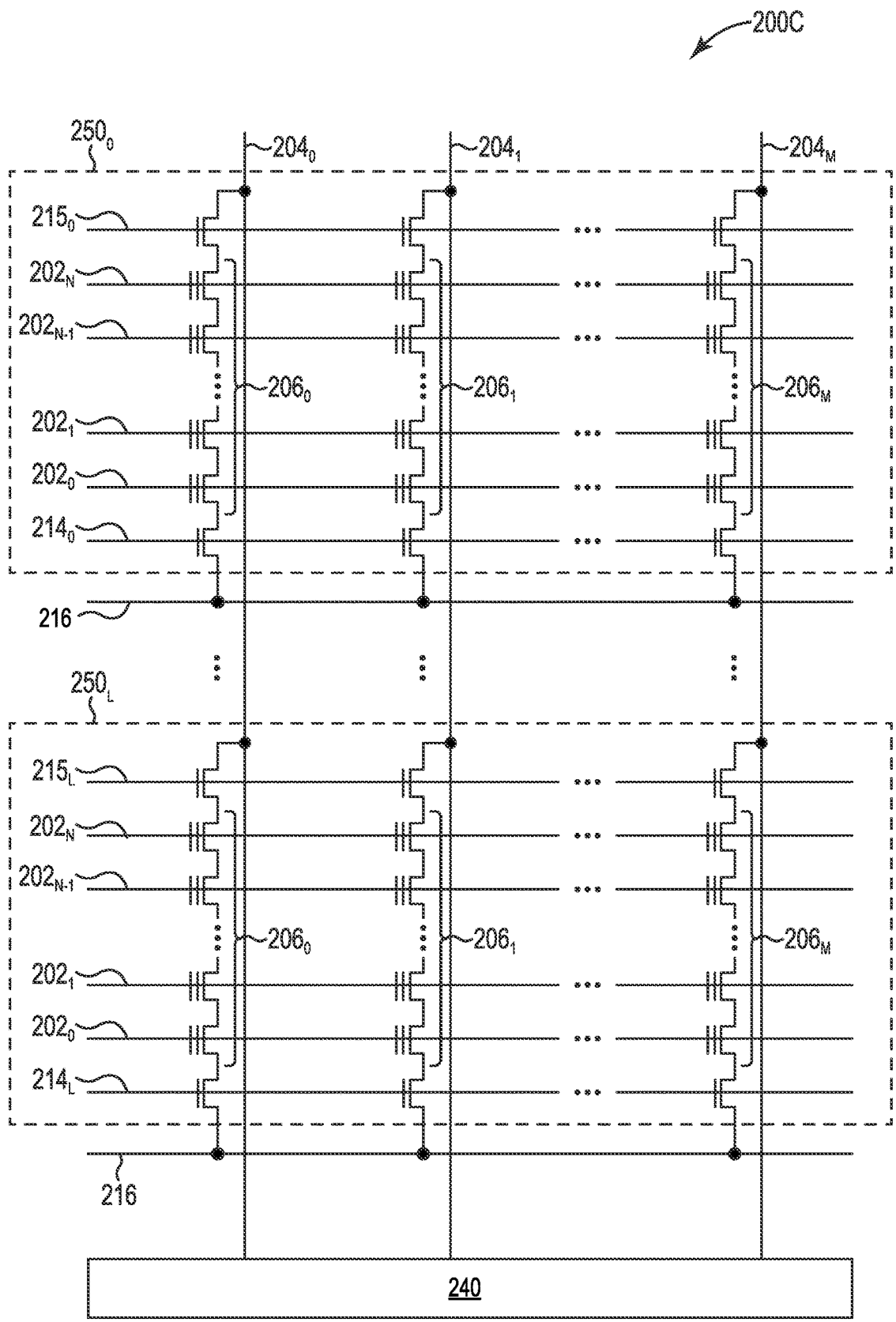

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250, e.g., blocks of memory cells $250_0$ to $250_L$. Blocks of memory cells 250 may be groupings of memory cells 208 that may be erased together in a single erase operation, sometimes referred to as erase blocks. Each block of memory cells 250 might include those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$ to $250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$ to $250_L$.

The data lines $204_0$ to $204_M$ may be connected (e.g., selectively connected) to a buffer portion 240, which might be a portion of a data buffer of the memory. The buffer portion 240 might correspond to a memory plane (e.g., the set of blocks of memory cells $250_0$ to $250_L$). The buffer portion 240 might include sense circuits (not shown in FIG. 2C) for sensing data values indicated on respective data lines 204.

While the blocks of memory cells 250 of FIG. 2C depict only one select line 215 per block of memory cells 250, the blocks of memory cells 250 might include those NAND strings 206 commonly associated with more than one select line 215. For example, select line $215_0$ of block of memory cells $250_0$ might correspond to the select line $215_0$ of the memory array 200B of FIG. 2B, and the block of memory cells of the memory array 200C of FIG. 2C might further include those NAND strings 206 associated with select lines $215_1$ to $215_K$ of FIG. 2B. In such blocks of memory cells 250 having NAND strings 206 associated with multiple select lines 215, those NAND strings 206 commonly associated with a single select line 215 might be referred to as a sub-block of memory cells. Each such sub-block of memory cells might be selectively connected to the buffer portion 240 responsive to its respective select line 215.

Figure 3:
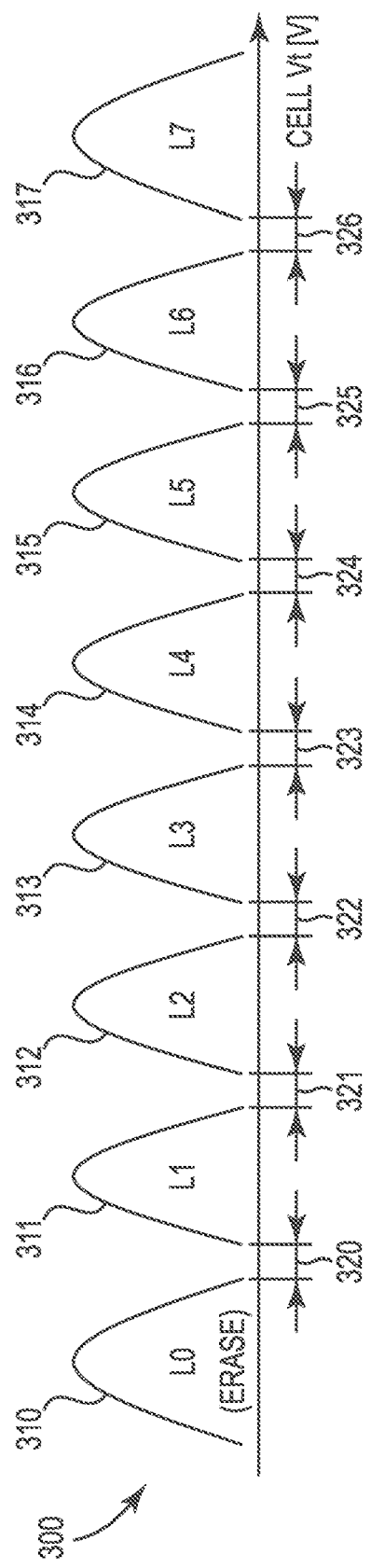
FIG. 3 depicts memory cell populations for a TLC memory according to an embodiment.

FIG. 3 depicts memory cell populations 300 for a memory according to an embodiment. For simplicity, FIG. 3 and the following FIGS. 4-7 will presume programming operations for TLC memory cells, e.g., eight-level memory cells representing data states L0, L1, L2, L3, L4, L5, L6, and L7 using eight threshold voltage ranges, each representing a data state corresponding to a bit pattern of three digits. While discussed in reference to TLC memory cells, programming operations performed on lower storage density memory cells, e.g., SLC (two data states) or higher storage density memory cells, e.g., QLC (16 data states) or PLC (32 data states) memory cells, are equally applicable.

In this example, the population of memory cells 310 might be erased memory cells and represent a logical data value of '111', the population of memory cells 311 might represent a logical data value of '011', the population of memory cells 312 might represent a logical data value of '001', the population of memory cells 313 might represent a logical data value of '101', the population of memory cells 314 might represent a logical data value of '100', the population of memory cells 315 might represent a logical data value of '000', the population of memory cells 316 might represent a logical data value of '010', and the population of memory cells 317 might represent a logical data value of '110', where the right-most digit might represent the lower page data for a memory cell having a threshold voltage within the threshold voltage range of its respective population of memory cells, the center digit might represent the upper page data for that memory cell, and the left-most digit might represent the extra page data for that memory cell. Although a specific example of binary representation is provided, embodiments may use other arrangements of bit patterns to represent the various data states.

A read window between the population of memory cells 310 and the population of memory cells 311 is indicated at 320, which is the distance (e.g., in voltage) between adjacent Vt distributions for the memory cells representing data states L0 and L1. A read window between the population of memory cells 311 and the population of memory cells 312 is indicated at 321, which is the distance (e.g., in voltage) between adjacent Vt distributions for the memory cells representing data states L1 and L2. Likewise, a read window between the population of memory cells 312, 313, 314, 315, and 316, and the population of memory cells 313, 314, 315, 316, and 317 is indicated at 322, 323, 324, 325, and 326, respectively, which is the distance between adjacent Vt distributions for the memory cells representing data states L2, L3, L4, L5, L6, and L7. A read window budget (RWB) may refer to a cumulative value of read windows for a group of programmed cells (e.g., one or more pages of cells). In this example, the RWB may be the cumulative value (e.g., in voltage) of the seven read windows 320-326 between the eight Vt distributions.

Figure 4:
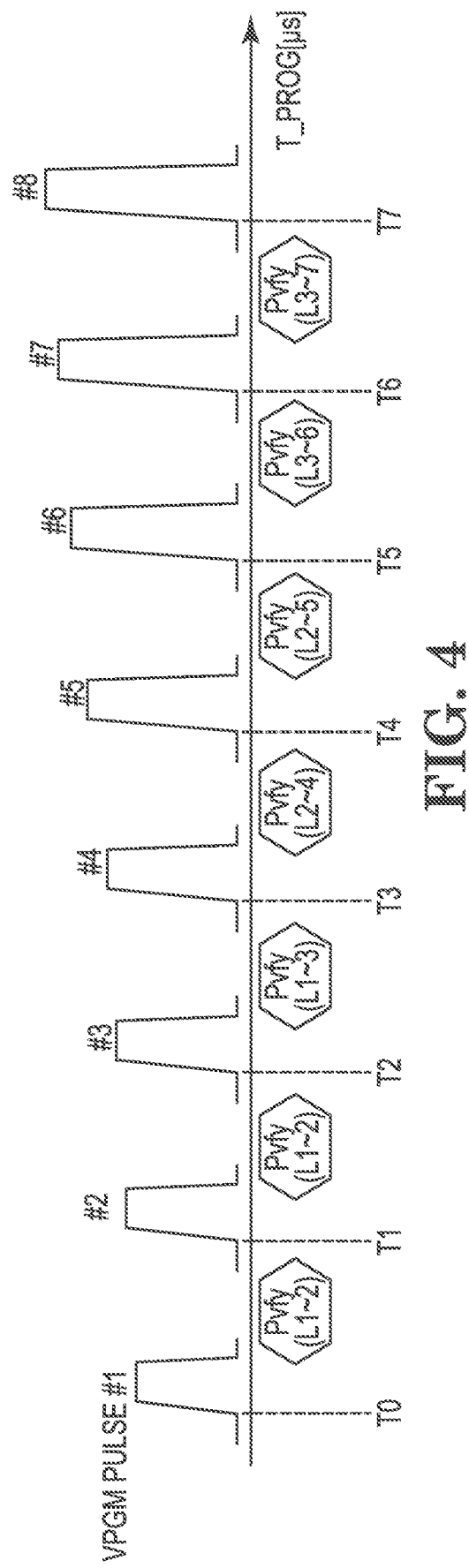
FIG. 4 is a timing diagram depicting a portion of a programming operation to program selected TLC memory cells to target threshold voltages according to an embodiment.

FIG. 4 is a timing diagram depicting a portion of a programming operation to program selected TLC memory cells to target levels L0 to L7 (e.g., as illustrated in FIG. 3) according to an embodiment. Once a selected memory cell has been programmed to its target level, the memory cell is inhibited from further programming. Prior to time t0, memory cells selected for programming might be erased such that the selected memory cells each have a threshold voltage corresponding to level L0. At time t0, a first program pulse is applied to a selected access line (e.g., 202 of FIG. 2A) connected to the control gates (e.g., 236) of the selected memory cells (e.g., 208). After the first program pulse, a program verify operation may be performed to verify whether a target population of the selected memory cells has been programmed to level L1 or L2. At time t1, a second program pulse, e.g., higher than the first program pulse, is applied to the selected access line connected to the control gates of the selected memory cells. After the second program pulse, a program verify operation may be performed to verify whether target populations of the selected memory cells have been programmed to level L1 or L2.

At time t2, a third program pulse, e.g., higher than the second program pulse, is applied to the selected access line connected to the control gates of the selected memory cells. After the third program pulse, a program verify operation may be performed to verify whether target populations of the selected memory cells have been programmed to level L1, L2, or L3. At time t3, a fourth program pulse, e.g., higher than the third program pulse, is applied to the selected access line connected to the control gates of the selected memory cells. After the fourth program pulse, a program verify operation may be performed to verify whether target populations of the selected memory cells have been programmed to level L2, L3, or L4. At time t4, a fifth program pulse, e.g., higher than the fourth program pulse, is applied to the selected access line connected to the control gates of the selected memory cells. After the fifth program pulse, a program verify operation may be performed to verify whether target populations of the selected memory cells have been programmed to level L2, L3, L4, or L5.

At time t5, a sixth program pulse, e.g., higher than the fifth program pulse, is applied to the selected access line connected to the control gates of the selected memory cells. After the sixth program pulse, a program verify operation may be performed to verify whether target populations of the selected memory cells have been programmed to level L3, L4, L5, or L6. At time t6, a seventh program pulse, e.g., higher than the sixth program pulse, is applied to the selected access line connected to the control gates of the selected memory cells. After the seventh program pulse, a program verify operation may be performed to verify whether target populations of the selected memory cells have been programmed to level L3, L4, L5, L6, or L7. At time t7, an eighth program pulse, e.g., higher than the seventh program pulse, may be applied to the selected access line connected to the control gates of the selected memory cells and the process may repeat until the selected memory cells have been programmed to their target levels.

Figure 5:
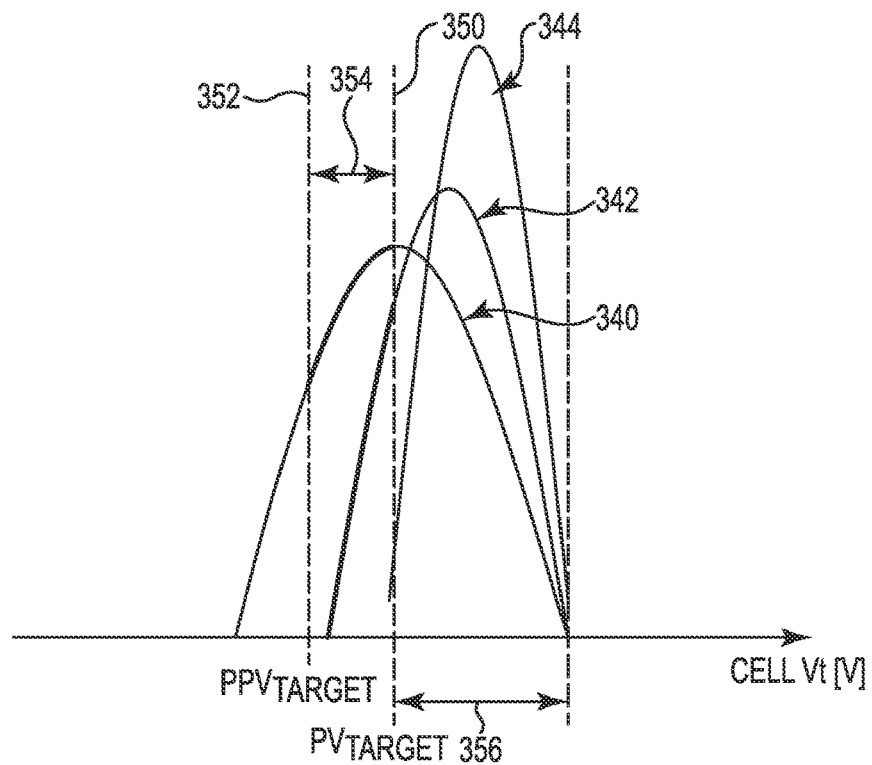
FIG. 5 depicts a population of memory cells during a programming operation to program selected memory cells to a target level according to an embodiment.

FIG. 5 depicts a population of memory cells during a programming operation to program selected memory cells to a target level according to an embodiment. FIG. 5 includes the population of memory cells after a particular program pulse as indicated at 340, the population of memory cells after a first subsequent program pulse as indicated at 342, and the population of memory cells after a second subsequent program pulse as indicated at 344. While FIG. 5 illustrates the population of memory cells being programmed to a target level after three program pulses, in other examples, any suitable number of program pulses may be used to program the population of memory cells to the target level. The particular program pulse may be the first program pulse of a programming operation or may be a later program pulse of a programming operation. The first subsequent program pulse may be immediately subsequent to the particular program pulse, and the second subsequent program pulse may be immediately subsequent to the first subsequent program pulse. For example, referring back to FIG. 4, for a target level of L3, the particular pulse may be the third program pulse at time t2, the first subsequent program pulse may be the fourth program pulse at time t3, and the second subsequent program pulse may be the fifth program pulse at time t4.

The use of different voltages levels on data lines to be enabled for programming might occur in programming schemes known as selective slow programming convergence (SSPC), where memory cells nearer to their respective intended data states are programmed more slowly (e.g., partially enabled for programming) compared to memory cells farther from their respective intended data states (e.g., fully enabled for programming) while receiving a same voltage level at their respective control gates. The target level may correspond to a minimum threshold voltage ($PV_{TARGET}$) 350 for the target level, which may be referred to as the final program verify level for the target level. A final pre-program verify level ($PPV_{TARGET}$) 352 may be selected to be less than the final program verify level 350 to enable SSPC programming. After the particular program pulse, a program verify operation is performed to sense the threshold voltage of each memory cell within the population of memory cells 340. Memory cells having a threshold voltage less than the final pre-program verify level 352 are biased for non-SSPC programming. Memory cells having a threshold voltage between the final pre-program verify level 352 and the final program verify level 350 are biased for SSPC programming since the memory cells fall within an SSPC range as indicated at 354. Memory cells having a threshold voltage greater than the final program verify level 350 are inhibited from further programming.

With each memory cell within the population of memory cells 340 biased for non-SSPC programming, SSPC programming, or inhibited from programming, the first subsequent program pulse is applied to the population of memory cells 340 to provide the population of memory cells 342. After the first subsequent program pulse, a program verify operation is performed to sense the threshold voltage of each memory cell within the population of memory cells 342. Memory cells having a threshold voltage less than the final pre-program verify level 352 (e.g., none of the memory cells in this example) are biased for non-SSPC programming. Memory cells having a threshold voltage between the final pre-program verify level 352 and the final program verify level 350 are biased for SSPC programming since the memory cells fall within the SSPC range 354. Memory cells having a threshold voltage greater than the final program verify level 350 are inhibited from further programming.

With each memory cell within the population of memory cells 342 biased for non-SSPC programming, SSPC programming, or inhibited from programming, the second subsequent program pulse is applied to the population of memory cells 342 to provide the population of memory cells 344. After the second subsequent program pulse, a program verify operation is performed to sense the threshold voltage of each memory cell within the population of memory cells 344. Memory cells having a threshold voltage less than the final pre-program verify level 352 (e.g., none of the memory cells in this example) are biased for non-SSPC programming. Memory cells having a threshold voltage between the final pre-program verify level 352 and the final program verify level 350 (e.g., none of the memory cells in this example) are biased for SSPC programming. Memory cells having a threshold voltage greater than the final program verify level 350 (e.g., all the memory cells in this example) are inhibited from further programming.

A memory cell may be biased for SSPC programming by biasing the data line connected to the memory cell to a SSPC level during the program pulse. A memory cell may be biased for non-SSPC programming by biasing the data line connected to the memory cell to a non-SSPC level during the program pulse. A memory cell may be inhibited from programming by biasing the data line connected to the memory cell to an inhibit level during the program pulse. The SSPC level (e.g., 1V) might be greater than the non-SSPC level (e.g., 0V) and less than the inhibit level (e.g., 3V).

A state-width for a population of memory cells is the difference between a minimum threshold voltage and a maximum threshold voltage for the population of memory cells programmed to the target level. The state-width for the population of memory cells 344 is indicated at 356. The state-width may affect the RWB. A larger state-width may result in a smaller RWB, while a smaller state-width may result in a larger RWB. Accordingly, it may be desirable to reduce the state-width of memory cell populations to improve the RWB, as described below with reference to FIG. 6.

Figure 6:
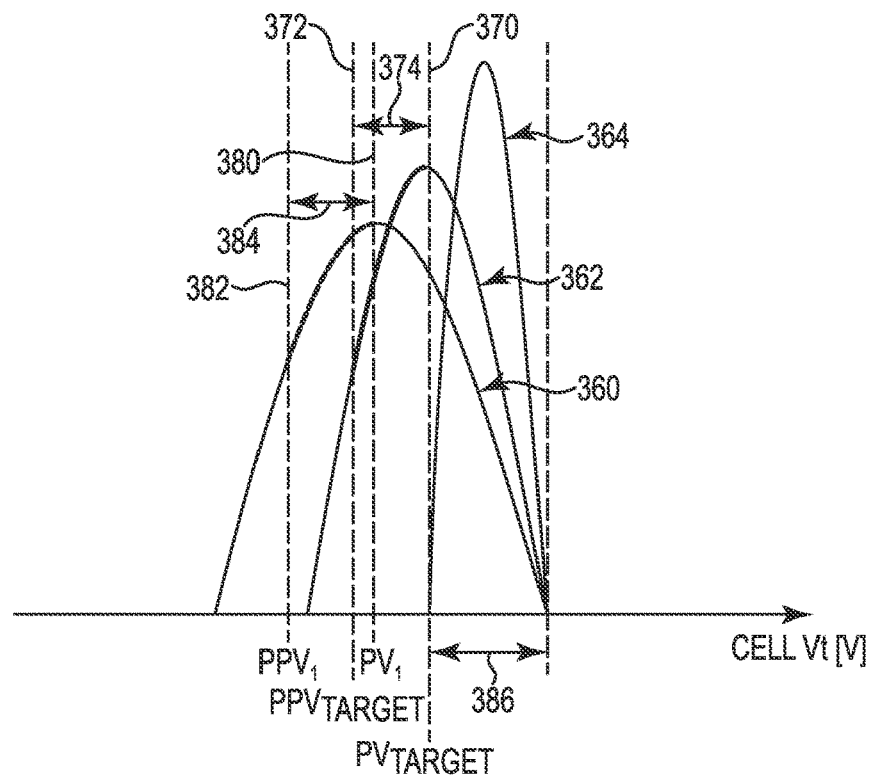
FIG. 6 depicts a population of memory cells during a programming operation to program selected memory cells to a target level according to another embodiment.

FIG. 6 depicts a population of memory cells during a programming operation to program selected memory cells to a target threshold voltage according to another embodiment. FIG. 6 includes the population of memory cells after a particular program pulse as indicated at 360, the population of memory cells after a first subsequent program pulse as indicated at 362, and the population of memory cells after a second subsequent program pulse as indicated at 364. While FIG. 6 illustrates the population of memory cells being programmed to a target level after three program pulses, in other examples, any suitable number of program pulses may be used to program the population of memory cells to the target level. The particular program pulse may be the first program pulse of a programming operation or may be a later program pulse of a programming operation. The first subsequent program pulse may be immediately subsequent to the particular program pulse, and the second subsequent program pulse may be immediately subsequent to the first subsequent program pulse. For example, referring back to FIG. 4, for a target level of L3, the particular pulse may be the third program pulse at time t2, the first subsequent program pulse may be the fourth program pulse at time t3, and the second subsequent program pulse may be the fifth program pulse at time t4.

The target level may correspond to a minimum threshold voltage ($PV_{TARGET}$) 370 for the target level, which may be referred to as the final program verify level for the target level. A final pre-program verify level ($PPV_{TARGET}$) 372 may be selected to be less than the final program verify level 370 to enable SSPC programming. In contrast to the embodiment of FIG. 5, however, this embodiment also includes a first program verify level ($PV_1$) 380 selected to be less than the final program verify level 370, and a first pre-program verify level ($PPV_1$) 382 selected to be less than the final pre-program verify level 372. In one example, the first program verify level 380 might equal the final program verify level 370 minus 1V.

While two program verify levels 370 and 380 and two corresponding pre-program verify levels 372 and 382 are illustrated in FIG. 6, in other embodiments more than two program verify levels and more than two corresponding pre-program verify levels may be used. For example, one, two, three, or more additional program verify levels may be included between the first program verify level 380 and the final program verify level 370, and additional corresponding pre-program verify levels may be included between the first pre-program verify level 382 and the final pre-program verify level 372. The additional program verify levels may be equally spaced between the first program verify level 380 and the final program verify level 370, and the additional corresponding pre-program verify levels may be equally spaced between the first pre-program verify level 382 and the final pre-program verify level 372.

After the particular program pulse, a program verify operation is performed to sense the threshold voltage of each memory cell within the population of memory cells 360. Memory cells having a threshold voltage less than the first pre-program verify level 382 are biased for non-SSPC programming. Memory cells having a threshold voltage between the first pre-program verify level 382 and the first program verify level 380 are biased for SSPC programming since the memory cells fall within a first SSPC range as indicated at 384. Memory cells having a threshold voltage greater than the first program verify level 380 are inhibited from programming.

With each memory cell within the population of memory cells 360 biased for non-SSPC programming, SSPC programming, or inhibited from programming, the first subsequent program pulse is applied to the population of memory cells 360 to provide the population of memory cells 362. After the first subsequent program pulse, a program verify operation is performed to sense the threshold voltage of each memory cell within the population of memory cells 362. Memory cells having a threshold voltage less than the final pre-program verify level 372 are biased for non-SSPC programming. Memory cells having a threshold voltage between the final pre-program verify level 372 and the final program verify level 370 are biased for SSPC programming since the memory cells fall within the final SSPC range as indicated at 374. Memory cells having a threshold voltage greater than the final program verify level 370 are inhibited from further programming.

With each memory cell within the population of memory cells 362 biased for non-SSPC programming, SSPC programming, or inhibited from programming, the second subsequent program pulse is applied to the population of memory cells 362 to provide the population of memory cells 364. After the second subsequent program pulse, a program verify operation is performed to sense the threshold voltage of each memory cell within the population of memory cells 364. Memory cells having a threshold voltage less than the final pre-program verify level 372 (e.g., none of the memory cells in this example) are biased for non-SSPC programming. Memory cells having a threshold voltage between the final pre-program verify level 372 and the final program verify level 370 (e.g., none of the memory cells in this example) are biased for SSPC programming. Memory cells having a threshold voltage greater than the final program verify level 370 (e.g., all the memory cells in this example) are inhibited from further programming.

In the embodiment of FIG. 6, the first pre-program verify level 382 and the first program verify level 380 are used for the program verify operation after the particular program pulse, and the final pre-program verify level 372 and the final program verify level 370 are used for the program verify operation after the first subsequent program pulse. In embodiments where additional pre-program verify levels and corresponding program verify levels are used, the pre-program verify level and program verify level used for each program verify operation increases for each subsequent program pulse until the final pre-program verify level 372 and the final program verify level 370 are reached. Compared to the embodiment of FIG. 5, these dynamic pre-program verify and program verify levels increase the number of memory cells falling within a SSPC range (e.g., SSPC range 384 or 374), thereby slowing the programming of an increased number of memory cells. By slowing the programming of an increased number of memory cells, the population of memory cells 364 has a smaller overshoot over the final program verify level 370.

The state-width for the population of memory cells 364 programmed to the target level is indicated at 386. Compared to the state-width 356 for the population of memory cells 344 in FIG. 5, the state-width 386 for the population of memory cells 364 is smaller. Accordingly, the RWB for populations of memory cells programmed according to FIG. 6 using dynamic pre-program verify and program verify levels is improved compared to the RWB for populations of memory cells programmed according to FIG. 5 using fixed pre-program verify and program verify levels.

Figure 7:
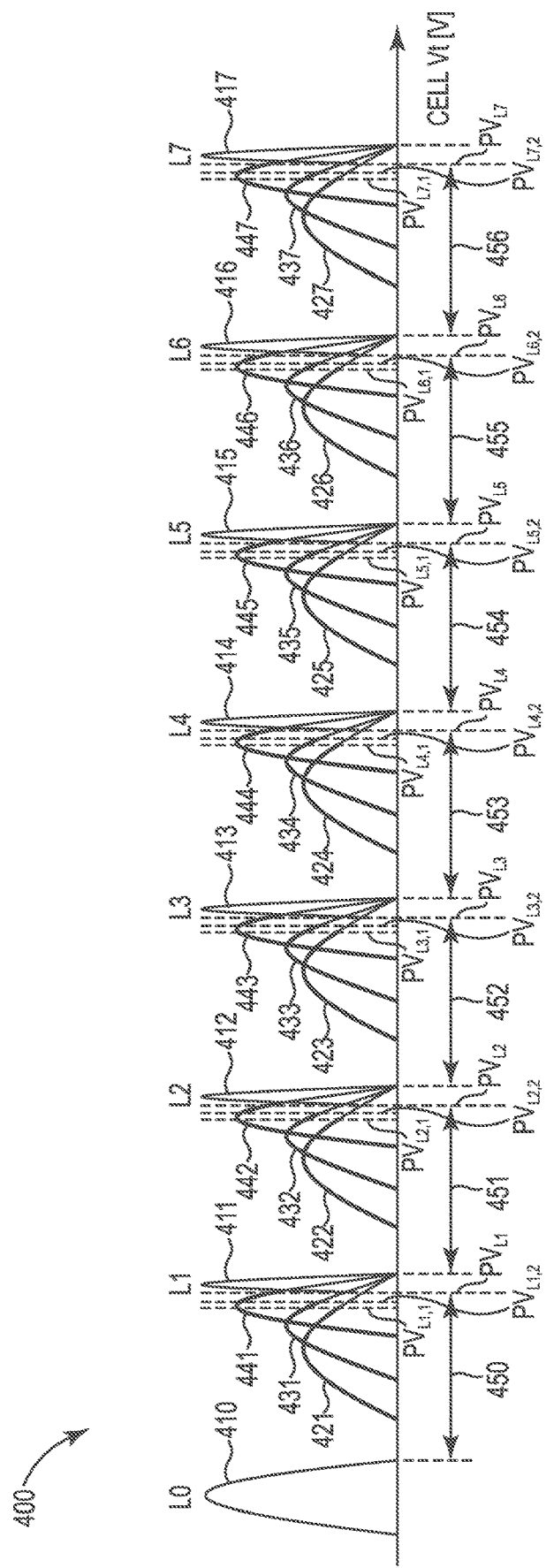
FIG. 7 depicts memory cell populations for a TLC memory during a programming operation to program selected TLC memory cells to target threshold voltages according to an embodiment.

FIG. 7 depicts memory cell populations 400 for a TLC memory during a programming operation to program selected TLC memory cells to target threshold voltages according to an embodiment. After programming is complete, a population of memory cells 410 is programmed (e.g., erased) to level L0, a population of memory cells 411 is programmed to level L1, a population of memory cells 412 is programmed to level L2, a population of memory cells 413 is programmed to level L3, a population of memory cells 414 is programmed to level L4, a population of memory cells 415 is programmed to level L5, a population of memory cells 416 is programmed to level L6, and a population of memory cells 417 is programmed to level L7.

In this example, at least four program pulses are used to program the populations of memory cells 411-417. In other examples, however, less than four program pulses or more than four program pulses may be used, and the number of program pulses may depend on the type of memory (e.g., SLC, QLC, PLC) being programmed. FIG. 7 also includes populations of memory cells 421-427 after a particular program pulse, populations of memory cells 431-437 after a first subsequent program pulse, and populations of memory cells 441-447 after a second subsequent program pulse, wherein the populations of memory cells 411-417 may be reached after a third subsequent program pulse. While FIG. 7 illustrates each population of memory cells being programmed to a target level after at least four program pulses, in other examples, any suitable number of program pulses may be used to program each population of memory cells to the target level. The first subsequent program pulse may be immediately subsequent to the particular program pulse, the second subsequent program pulse may be immediately subsequent to the first subsequent program pulse, and the third subsequent program pulse may be immediately subsequent to the second subsequent program pulse.

A first program verify level for each level L1 to L7 is indicated by $PV_{L1,1}$ to $PV_{L7,1}$, respectively. A second program verify level for each level L1 to L7 is indicated by $PV_{L1,2}$ to $PV_{L7,2}$, respectively. The final program verify level for each level L1 to L7 is indicated by $PV_{L1}$ to $PV_{L7}$, respectively. Each first program verify level $PV_{L1,1}$ to $PV_{L7,1}$ may be selected to be less than the respective second program verify level $PV_{L1,2}$ to $PV_{L7,2}$, and each second program verify level $PV_{L1,2}$ to $PV_{L7,2}$ may be selected to be less than the respective final program verify level $PV_{L1}$ to $PV_{L7}$. While not shown in FIG. 7, each program verify level may correspond to a respective pre-program verify level as previously described to enable SSPC programming. While three program verify levels for each target level L1 to L7 are illustrated in FIG. 7, in other embodiments more than three program verify levels (and more than three corresponding pre-program verify levels) may be used.

After the particular program pulse, a program verify operation is performed to sense the threshold voltage of each memory cell within the populations of memory cells 421-427. Memory cells having a threshold voltage less than a respective first pre-program verify level are biased for non-SSPC programming. Memory cells having a threshold voltage between a respective first pre-program verify level and the respective first program verify level $PV_{L1,1}$ to $PV_{L7,1}$ are biased for SSPC programming. Memory cells having a threshold voltage greater than the respective first program verify level $PV_{L1,1}$ to $PV_{L7,1}$ are inhibited from programming.

With each memory cell within the populations of memory cells 421-427 biased for non-SSPC programming, SSPC programming, or inhibited from programming, the first subsequent program pulse is applied to the populations of memory cells 421-427 to provide the populations of memory cells 431-437. After the first subsequent program pulse, a program verify operation is performed to sense the threshold voltage of each memory cell within the populations of memory cells 431-437. Memory cells having a threshold voltage less than a respective second pre-program verify level are biased for non-SSPC programming. Memory cells having a threshold voltage between the respective second pre-program verify level and the second program verify level $PV_{L1,2}$ to $PV_{L7,2}$ are biased for SSPC programming. Memory cells having a threshold voltage greater than the respective second program verify level $PV_{L1,2}$ to $PV_{L7,2}$ are inhibited from programming.

With each memory cell within the populations of memory cells 431-437 biased for non-SSPC programming, SSPC programming, or inhibited from programming, the second subsequent program pulse is applied to the populations of memory cells 431-437 to provide the populations of memory cells 441-447. After the second subsequent program pulse, a program verify operation is performed to sense the threshold voltage of each memory cell within the populations of memory cells 441-447. Memory cells having a threshold voltage less than a respective final pre-program verify level are biased for non-SSPC programming. Memory cells having a threshold voltage between the respective final pre-program verify level and the final program verify level $PV_{L1}$ to $PV_{L7}$ are biased for SSPC programming. Memory cells having a threshold voltage greater than the respective final program verify level $PV_{L1}$ to $PV_{L7}$ are inhibited from further programming.

With each memory cell within the populations of memory cells 441-447 biased for non-SSPC programming, SSPC programming, or inhibited from programming, the third subsequent program pulse is applied to the populations of memory cells 441-447 to provide the populations of memory cells 411-417. After the third subsequent program pulse, a program verify operation is performed to sense the threshold voltage of each memory cell within the populations of memory cells 411-417. Memory cells having a threshold voltage less than a respective final pre-program verify level (e.g., none of the memory cells in this example) are biased for non-SSPC programming. Memory cells having a threshold voltage between the respective final pre-program verify level and the final program verify level $PV_{L1}$ to $PV_{L7}$ (e.g., none of the memory cells in this example) are biased for SSPC programming. Memory cells having a threshold voltage greater than the respective final program verify level $PV_{L1}$ to $PV_{L7}$ (e.g., all of the memory cells in this example) are inhibited from further programming. It is noted that a memory cell may be inhibited from programming during a program pulse due to a lower program verify level and become uninhibited from programming during a subsequent program pulse due to a higher program verify level.

In the embodiment of FIG. 7, the first program verify levels $PV_{L1,1}$ to $PV_{L7,1}$ are used for the program verify operation after the particular program pulse, the second program verify levels $PV_{L1,2}$ to $PV_{L7,2}$ are used for the program verify operation after the first subsequent program pulse, and the final program verify levels $PV_{L1}$ to $PV_{L7}$ are used for the program verify operation after the second subsequent program pulse. In other embodiments, however, additional program verify levels (and pre-program verify levels) may be included between the first program verify levels $PV_{L1,2}$ to $PV_{L7,2}$ and the final program verify levels $PV_{L1}$ to $PV_{L7}$.

A read window between the population of memory cells 410 and the population of memory cells 411 is indicated at 450 for the memory cells representing data states L0 and L1. A read window between the population of memory cells 411 and the population of memory cells 412 is indicated at 451 for the memory cells representing data states L1 and L2. Likewise, a read window between the population of memory cells 412, 413, 414, 415, and 416, and the population of memory cells 413, 414, 415, 416, and 417 is indicated at 452, 453, 454, 455, and 456, respectively, for the memory cells representing data states L2, L3, L4, L5, L6, and L7. In this example, the RWB may be the cumulative value (e.g., in voltage) of the seven read windows 450-456 between the eight Vt distributions. Due to the use of dynamic program verify levels, the RWB of the embodiment of FIG. 7 is improved compared to the RWB of the embodiment of FIG. 3. In addition, the improved RWB may be obtained without increasing the programming time, since the same number of program pulses may be used in either embodiment.

FIGS. 8A-8D are flowcharts of a method 500 of operating a memory in accordance with an embodiment. Method 500 may correspond at least in part to FIGS. 6 and 7. For example, FIG. 8A-8D might represent a method to perform a program operation, e.g., programming one or more memory cells to target levels. The method might be in the form of computer-readable instructions, e.g., stored to the instruction registers 128 of FIG. 1. Such computer-readable instructions might be executed by a controller, e.g., the control logic 116, to cause the memory device 100 to perform the method.

Figure 8A:
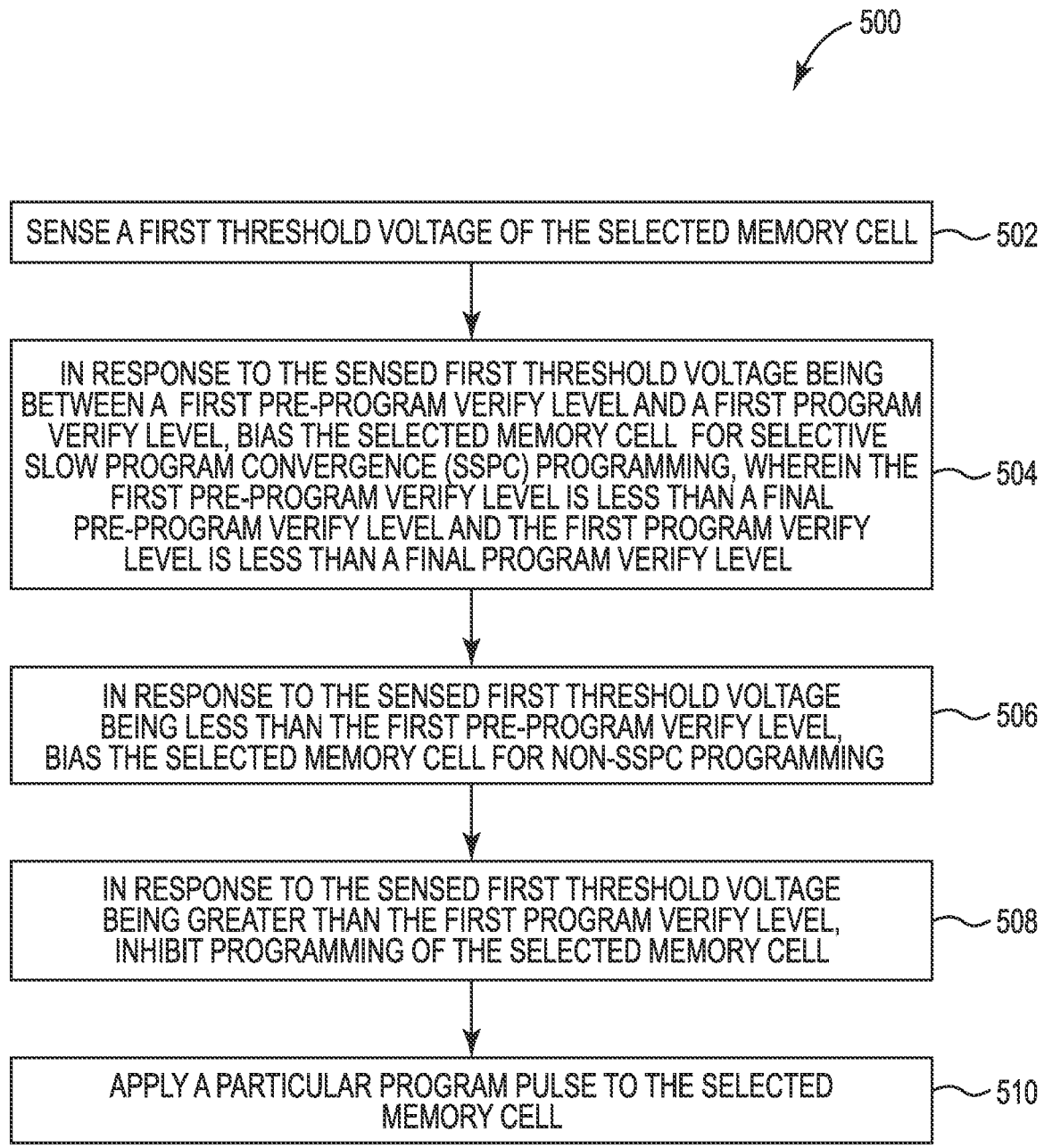
FIGS. 8A-8D are flowcharts of a method of operating a memory in accordance with an embodiment.

Method 500 might be implemented within a memory device (e.g., 100) including an array of memory cells (e.g., 104) and a controller (e.g., 116) configured to access the array of memory cells (e.g., TLC memory cells, QLC memory cells, or PLC memory cells) to program a selected memory cell (e.g., 208) of the array of memory cells to a target level. As illustrated in FIG. 8A at 502, the controller may sense a first threshold voltage of the selected memory cell. At 504, the controller may in response to the sensed first threshold voltage being between a first pre-program verify level (e.g., 382 of FIG. 6) and a first program verify level (e.g., 380 of FIG. 6), bias the selected memory cell for selective slow program convergence (SSPC) programming, wherein the first pre-program verify level is less than a final pre-program verify level (e.g., 372 of FIG. 6) and the first program verify level is less than a final program verify level (e.g., 370 of FIG. 6). At 506, the controller may in response to the sensed first threshold voltage being less than the first pre-program verify level, bias the selected memory cell for non-SSPC programming. At 508, the controller may in response to the sensed first threshold voltage being greater than the first program verify level, inhibit programming of the selected memory cell. At 510, the controller may apply a particular program pulse to the selected memory cell.

In one example, the difference between the first program verify level and the final program verify level might be less than or equal to 1V. The difference between the first pre-program verify level and the final pre-program verify level might equal the difference between the first program verify level and the final program verify level. The difference between the first pre-program verify level and the first program verify level might equal the difference between the final pre-program verify level and the final program verify level.

Figure 8B:
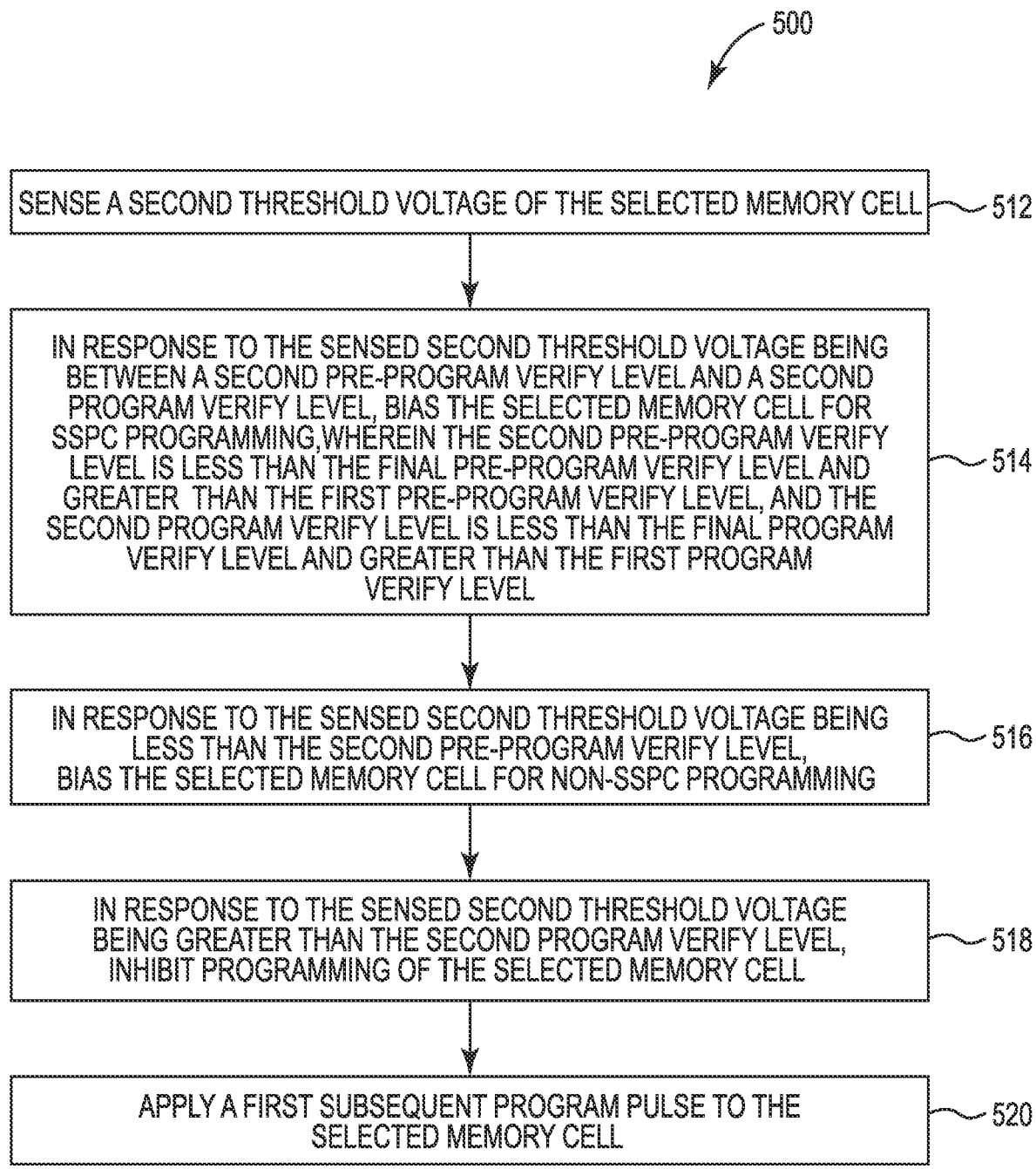

As illustrated in FIG. 8B at 512, the controller may further sense (e.g., after the particular pulse) a second threshold voltage of the selected memory cell. At 514, the controller may further in response to the sensed second threshold voltage being between a second pre-program verify level and a second program verify level, bias the selected memory cell for SSPC programming, wherein the second pre-program verify level is less than the final pre-program verify level and greater than the first pre-program verify level, and the second program verify level is less than the final program verify level and greater than the first program verify level. At 516, the controller may further in response to the sensed second threshold voltage being less than the second pre-program verify level, bias the selected memory cell for non-SSPC programming. At 518, the controller may further in response to the sensed second threshold voltage being greater than the second program verify level, inhibit programming of the selected memory cell. At 520, the controller may further apply a first subsequent program pulse to the selected memory cell. The first subsequent program pulse might be immediately subsequent to the particular program pulse.

In one example, the difference between the first program verify level and the second program verify level might equal the difference between the second program verify level and the final program verify level. The difference between the first pre-program verify level and the second pre-program verify level might equal the difference between the second pre-program verify level and the final pre-program verify level.

Figure 8C:
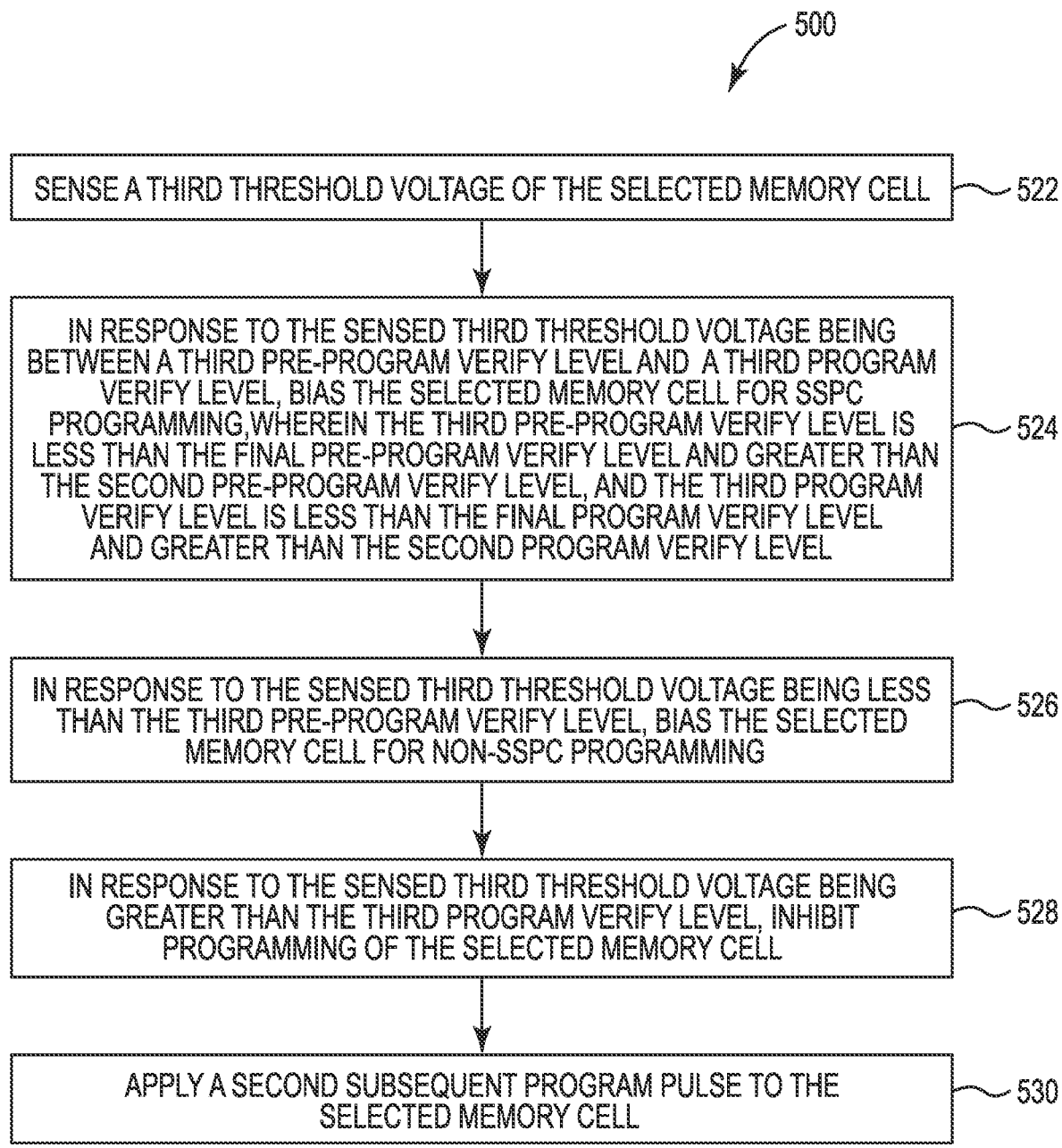

As illustrated in FIG. 8C at 522, the controller may further sense (e.g., after the first subsequent pulse) a third threshold voltage of the selected memory cell. At 524, the controller may further in response to the sensed third threshold voltage being between a third pre-program verify level and a third program verify level, bias the selected memory cell for SSPC programming, wherein the third pre-program verify level is less than the final pre-program verify level and greater than the second pre-program verify level, and the third program verify level is less than the final program verify level and greater than the second program verify level. At 526, the controller may further in response to the sensed third threshold voltage being less than the third pre-program verify level, bias the selected memory cell for non-SSPC programming. At 528, the controller may further in response to the sensed third threshold voltage being greater than the third program verify level, inhibit programming of the selected memory cell. At 530, the controller may further apply a second subsequent program pulse to the selected memory cell. The second subsequent program pulse might be immediately subsequent to the first subsequent program pulse.

In one example, the difference between the first program verify level and the second program verify level, the difference between the second program verify level and the third program verify level, and the difference between the third program verify level and the final program verify level might be equal. The difference between the first pre-program verify level and the second pre-program verify level, the difference between the second pre-program verify level and the third pre-program verify level, and the difference between the third pre-program verify level and the final pre-program verify level might be equal.

Figure 8D:
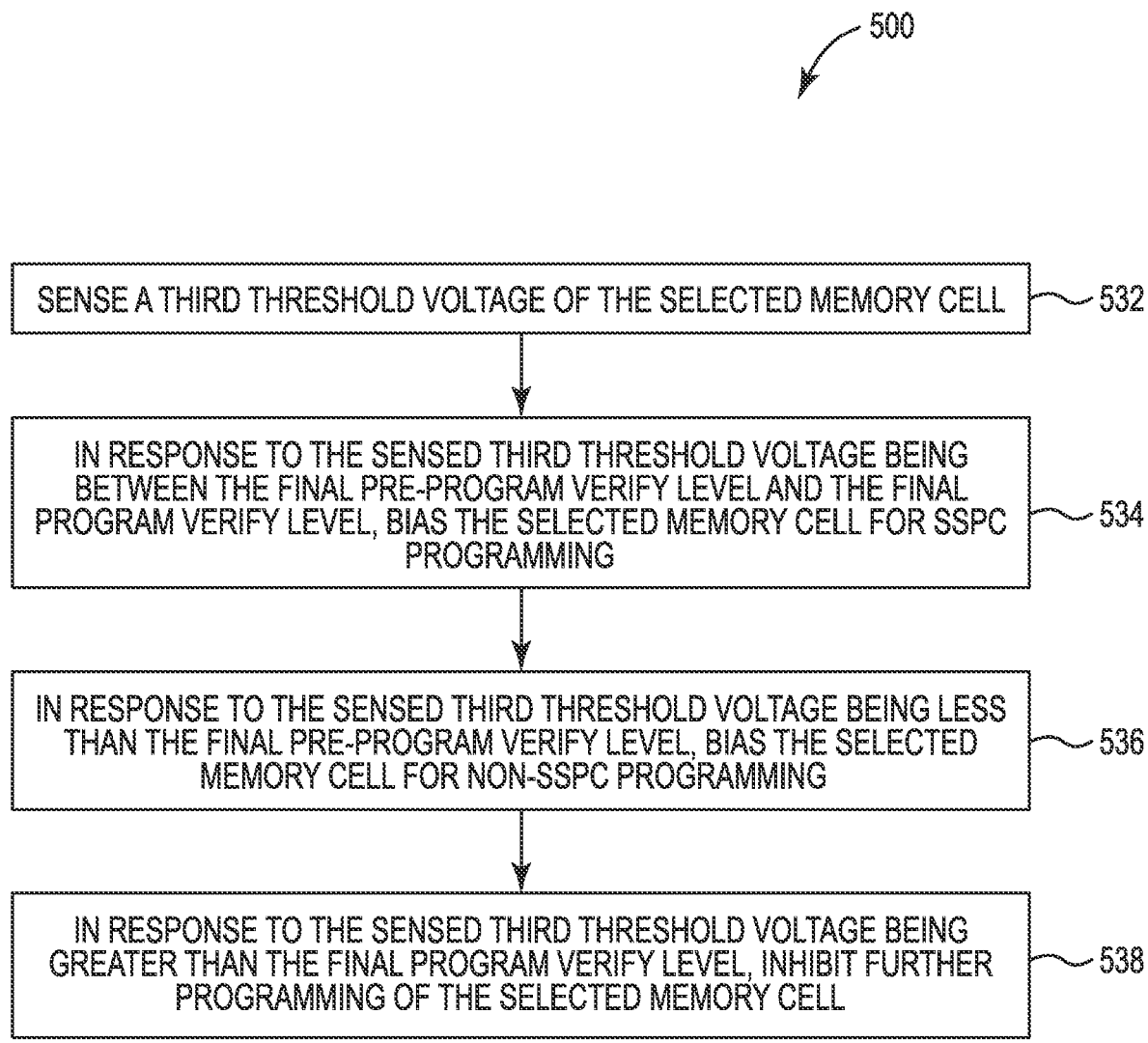

As illustrated in FIG. 8D at 532, the controller may alternatively sense (e.g., after the first subsequent pulse) a third threshold voltage of the selected memory cell. At 534, the controller may further in response to the sensed third threshold voltage being between the final pre-program verify level and the final program verify level, bias the selected memory cell for SSPC programming. At 536, the controller may further in response to the sensed third threshold voltage being less than the final pre-program verify level, bias the selected memory cell for non-SSPC programming. At 538, the controller may further in response to the sensed third threshold voltage being greater than the final program verify level, inhibit further programming of the selected memory cell.

Figure 9A:
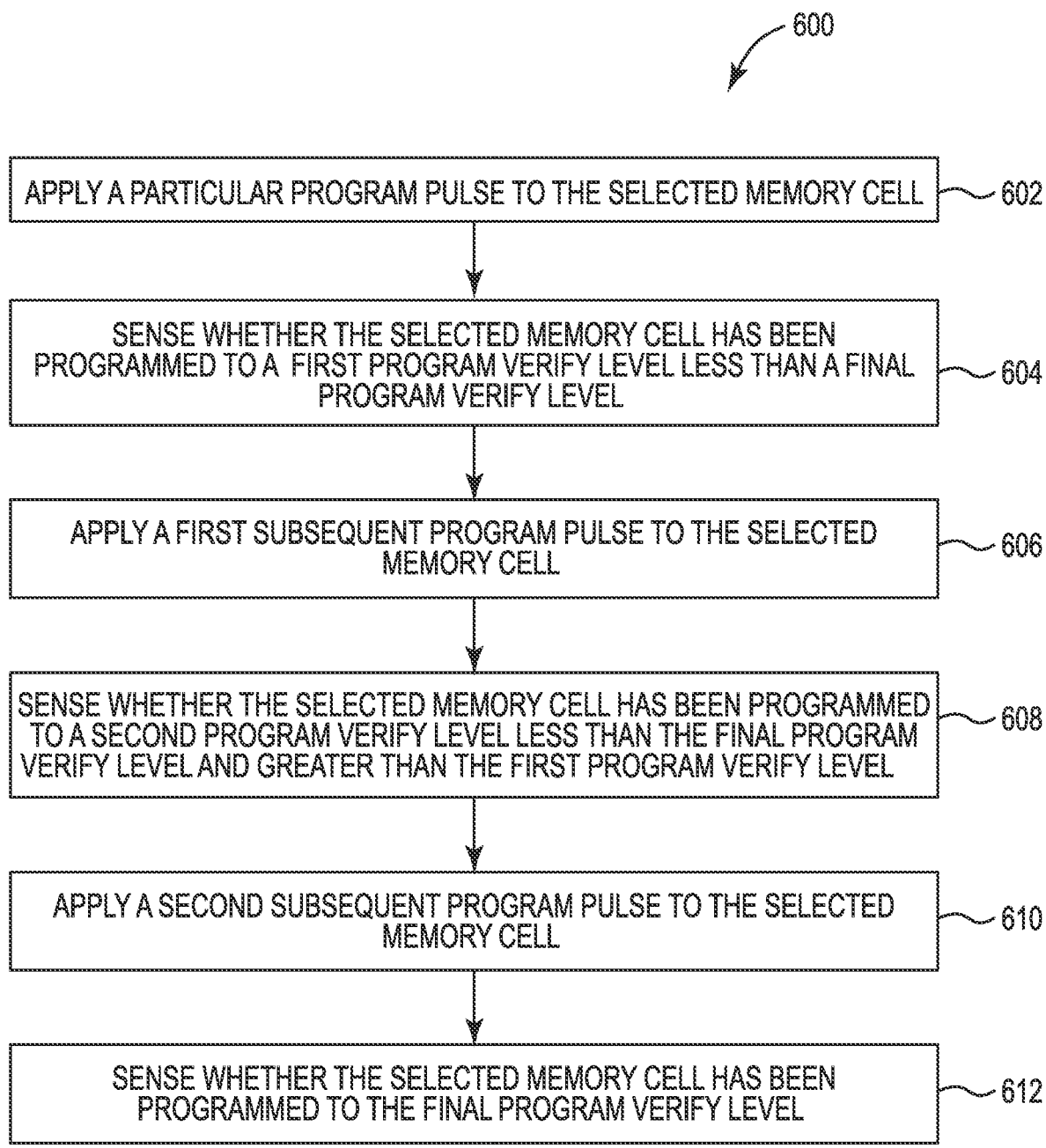
FIGS. 9A and 9B are flowcharts of a method of operating a memory in accordance with another embodiment.
Figure 9B:
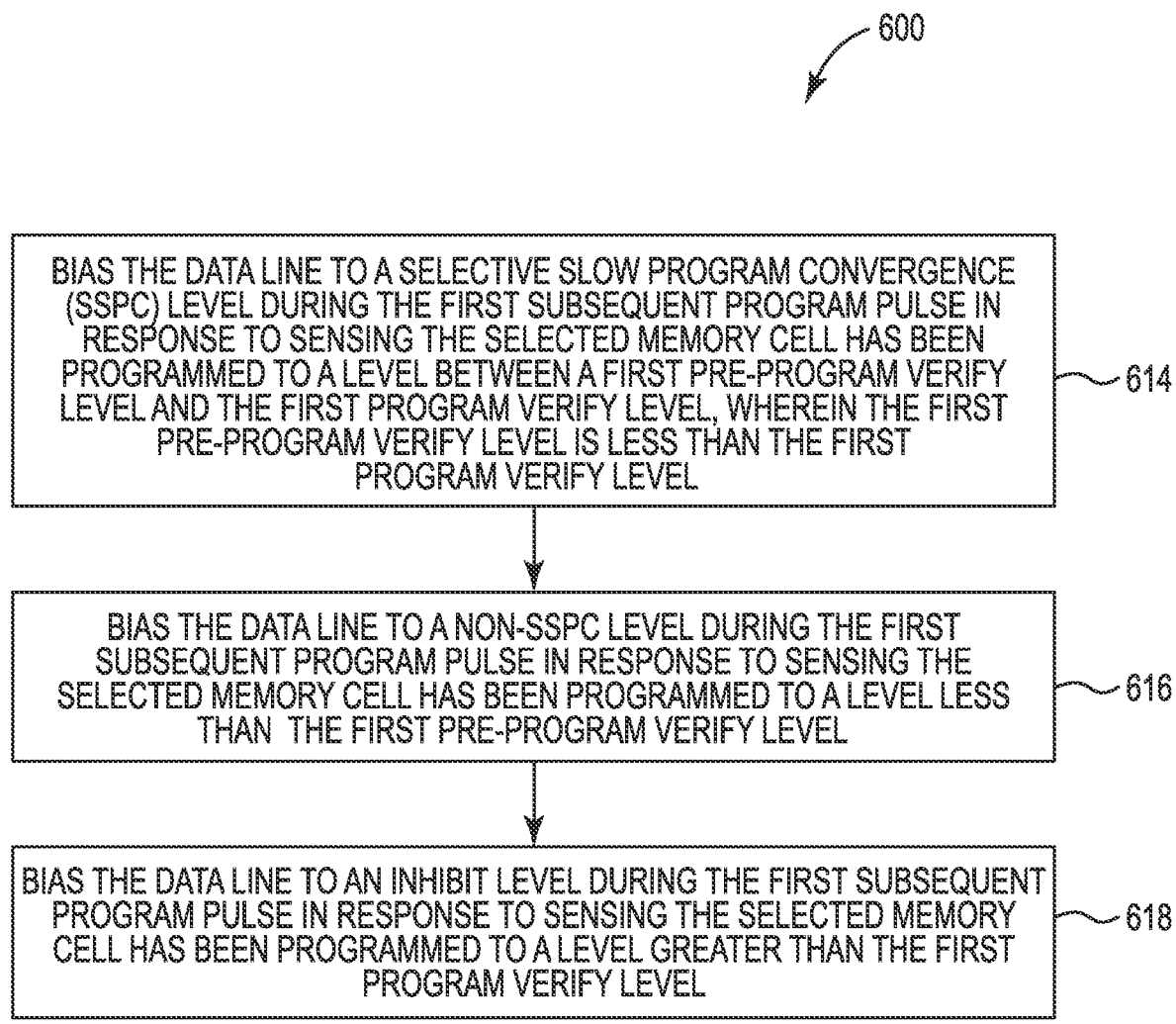

FIGS. 9A and 9B are flowcharts of a method 600 of operating a memory in accordance with another embodiment. Method 600 may correspond at least in part to FIGS. 6 and 7. For example, FIGS. 9A and 9B might represent a method to perform a program operation, e.g., programming one or more memory cells to target levels. The method might be in the form of computer-readable instructions, e.g., stored to the instruction registers 128 of FIG. 1. Such computer-readable instructions might be executed by a controller, e.g., the control logic 116, to cause the memory device 100 to perform the method.

Method 600 might be implemented within a memory device (e.g., 100) including an array of memory cells (e.g., 104) and a controller (e.g., 116) configured to access the array of memory cells (e.g., TLC memory cells, QLC memory cells, or PLC memory cells) to program a selected memory cell (e.g., 208) of the array of memory cells to a target level. As illustrated in FIG. 9A at 602, the controller may apply a particular program pulse to the selected memory cell. At 604, the controller may sense whether the selected memory cell has been programmed to a first program verify level (e.g., $PV_{L4,1}$ of FIG. 7) less than a final program verify level (e.g., $PV_{L4}$ of FIG. 7). At 606, the controller may apply a first subsequent program pulse to the selected memory cell. At 608, the controller may sense whether the selected memory cell has been programmed to a second program verify level (e.g., $PV_{L4,2}$ of FIG. 7) less than the final program verify level and greater than the first program verify level. At 610, the controller may apply a second subsequent program pulse to the selected memory cell. At 612, the controller may sense whether the selected memory cell has been programmed to the final program verify level. The first subsequent program pulse might be immediately subsequent to the particular program pulse, and the second subsequent program pulse might be immediately subsequent to the first subsequent program pulse. In one example, the difference between the first program verify level and the second program verify level might equal the difference between the second program verify level and the final program verify level.

The memory device within which method 600 is implemented may further include a data line (e.g., 204) selectively connected to the selected memory cell as previously described and with reference to FIGS. 2A-2C. In this embodiment, as illustrated in FIG. 9B at 614, the controller may further bias the data line to a selective slow program convergence (SSPC) level during the first subsequent program pulse in response to sensing the selected memory cell has been programmed to a level between a first pre-program verify level and the first program verify level, wherein the first pre-program verify level is less than the first program verify level. At 616, the controller may further bias the data line to a non-SSPC level during the first subsequent program pulse in response to sensing the selected memory cell has been programmed to a level less than the first pre-program verify level. At 618, the controller may further bias the data line to an inhibit level during the first subsequent program pulse in response to sensing the selected memory cell has been programmed to a level greater than the first program verify level. The SSPC level might be greater than the non-SSPC level and less than the inhibit level.

The memory device within which method 600 is implemented may further include an access line (e.g., 202) connected to a control gate (e.g., 236) of the selected memory cell as previously described with reference to FIGS. 2A-2C. In this embodiment, the controller may further apply the particular program pulse, the first subsequent program pulse, and the second subsequent program pulse to the access line.

FIGS. 10A-10D are flowcharts of a method 700 of operating a memory in accordance with another embodiment. Method 700 may correspond at least in part to FIGS. 6 and 7. For example, FIG. 10A-10D might represent a method to perform a program operation, e.g., programming one or more memory cells to target levels. The method might be in the form of computer-readable instructions, e.g., stored to the instruction registers 128 of FIG. 1. Such computer-readable instructions might be executed by a controller, e.g., the control logic 116, to cause the memory device 100 to perform the method.

Figure 10A:
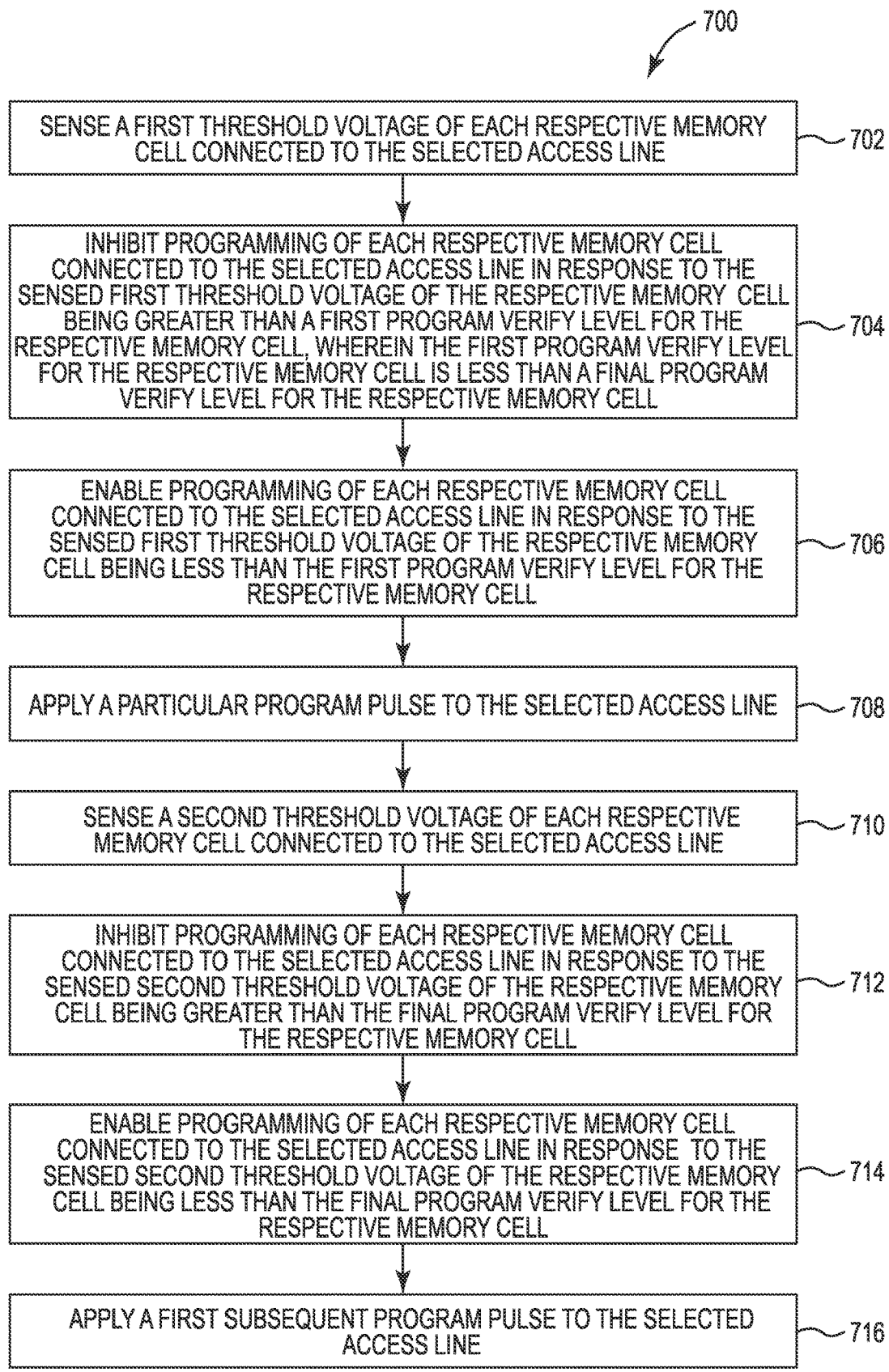
FIGS. 10A-10D are flowcharts of a method of operating a memory in accordance with another embodiment.

Method 700 might be implemented within a memory device (e.g., 100) including an array of memory cells (e.g., 104) including a plurality of strings of series-connected memory cells (e.g., 206); a plurality of access lines (e.g., 202), wherein each access line might be connected to a control gate (e.g., 236) of a respective memory cell (e.g., 208) of each string of series-connected memory cells (e.g., NAND strings); and a controller (e.g., 116) configured to program each respective memory cell connected to a selected access line to a respective target level. As illustrated in FIG. 10A at 702, the controller may sense a first threshold voltage of each respective memory cell connected to the selected access line. At 704, the controller may inhibit programming of each respective memory cell connected to the selected access line in response to the sensed first threshold voltage of the respective memory cell being greater than a first program verify level for the respective memory cell, wherein the first program verify level for the respective memory cell is less than a final program verify level for the respective memory cell. At 706, the controller may enable programming of each respective memory cell connected to the selected access line in response to the sensed first threshold voltage of the respective memory cell being less than the first program verify level for the respective memory cell. At 708, the controller may apply a particular program pulse to the selected access line. At 710, the controller may sense a second threshold voltage of each respective memory cell connected to the selected access line. At 712, the controller may inhibit programming of each respective memory cell connected to the selected access line in response to the sensed second threshold voltage of the respective memory cell being greater than the final program verify level for the respective memory cell. At 714, the controller may enable programming of each respective memory cell connected to the selected access line in response to the sensed second threshold voltage of the respective memory cell being less than the final program verify level for the respective memory cell. At 716, the controller may apply a first subsequent program pulse to the selected access line.

Figure 10B:
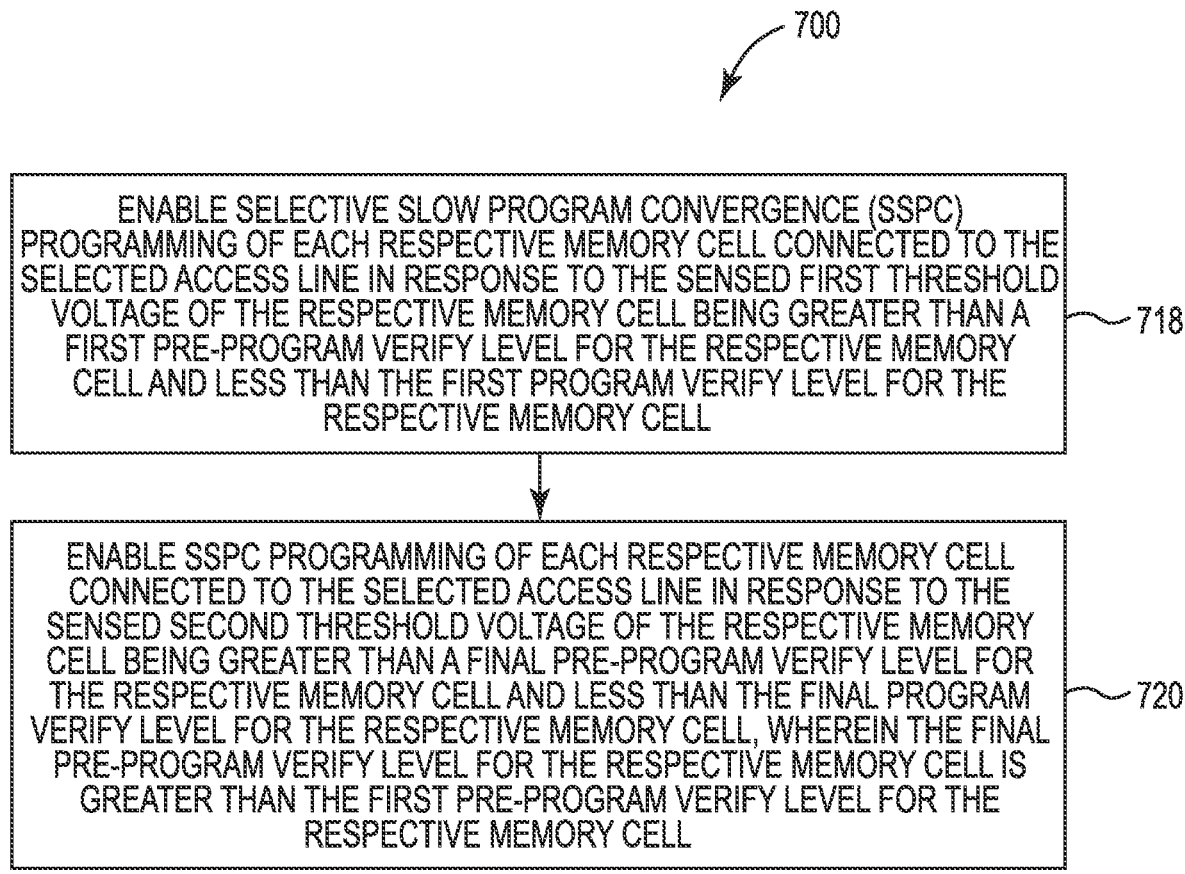

As illustrated in FIG. 10B at 718, the controller may further enable selective slow program convergence (SSPC) programming of each respective memory cell connected to the selected access line in response to the sensed first threshold voltage of the respective memory cell being greater than a first pre-program verify level for the respective memory cell and less than the first program verify level for the respective memory cell. At 720, the controller may further enable SSPC programming of each respective memory cell connected to the selected access line in response to the sensed second threshold voltage of the respective memory cell being greater than a final pre-program verify level for the respective memory cell and less than the final program verify level for the respective memory cell, wherein the final pre-program verify level for the respective memory cell is greater than the first pre-program verify level for the respective memory cell.

In one example, the difference between the first pre-program verify level for each respective memory cell and the first program verify level for each respective memory cell might equal the difference between the final pre-program verify level for each respective memory cell and the final program verify level for each respective memory cell.

Figure 10C:
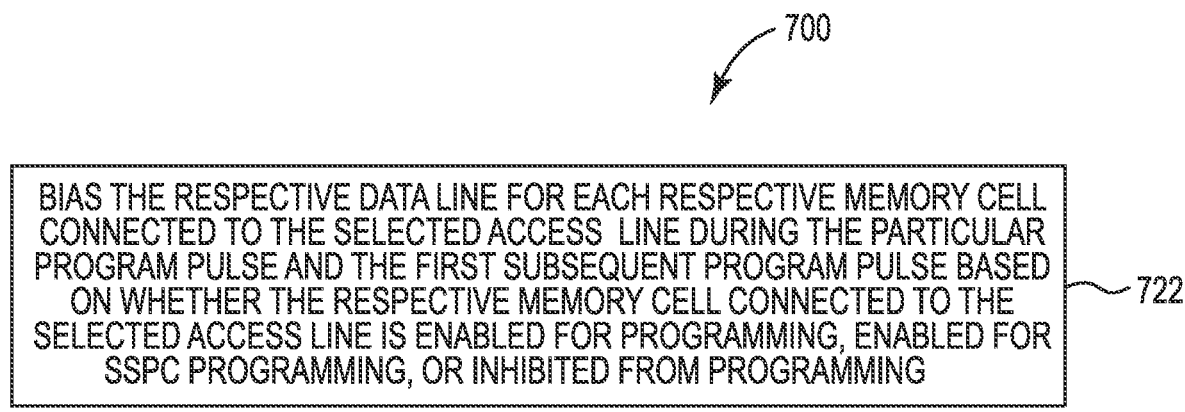

The memory device within which method 700 is implemented may further include a plurality of data lines (e.g., 204), wherein each string of series-connected memory cells is selectively electrically connected to a respective data line as previously described with reference to FIGS. 2A-2C. In this embodiment, as illustrated in FIG. 10C at 722, the controller may further bias the respective data line for each respective memory cell connected to the selected access line during the particular program pulse and the first subsequent program pulse based on whether the respective memory cell connected to the selected access line is enabled for programming, enabled for SSPC programming, or inhibited from programming.

Figure 10D:
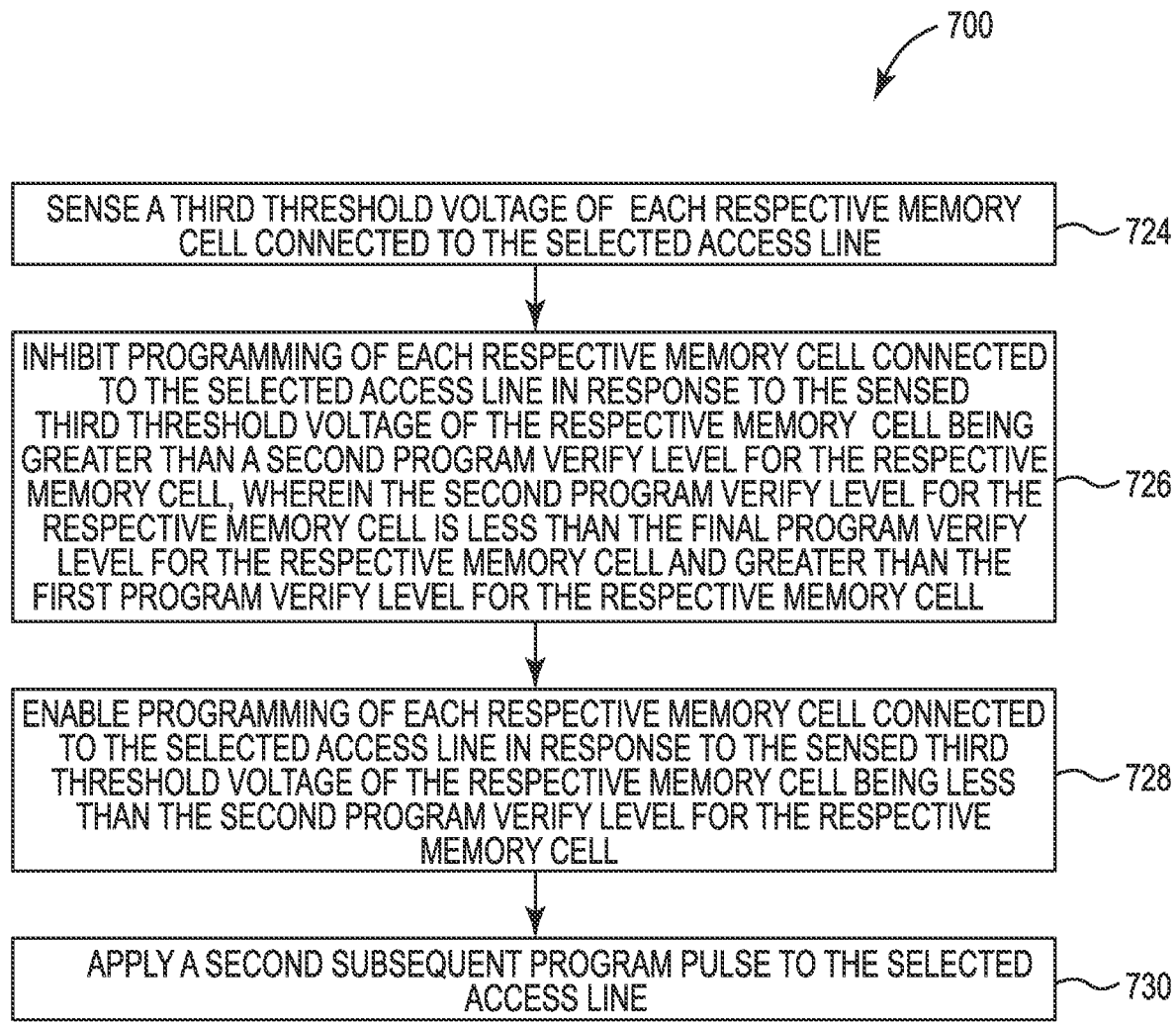

As illustrated in FIG. 10D at 724, the controller may further sense (e.g., after the first subsequent program pulse) a third threshold voltage of each respective memory cell connected to the selected access line. At 726, the controller may further inhibit programming of each respective memory cell connected to the selected access line in response to the sensed third threshold voltage of the respective memory cell being greater than a second program verify level for the respective memory cell, wherein the second program verify level for the respective memory cell is less than the final program verify level for the respective memory cell and greater than the first program verify level for the respective memory cell. At 728, the controller may further enable programming of each respective memory cell connected to the selected access line in response to the sensed third threshold voltage of the respective memory cell being less than the second program verify level for the respective memory cell. At 730, the controller may further apply a second subsequent program pulse to the selected access line. Method 700 may continue until each respective memory cell connected to the selected access line is verified to have a sensed threshold voltage greater than the final program verify level for the respective memory cell.

In one example, the difference between the first program verify level for each respective memory cell and the second program verify level for each respective memory cell might equal the difference between the second program verify level for each respective memory cell and the final program verify level for each respective memory cell. The difference between the first program verify level for each respective memory cell and the final program verify level for each respective memory cell might be less than or equal to 1V.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory device comprising:
an array of memory cells; and
a controller configured to access the array of memory cells to program a selected memory cell of the array of memory cells to a target level,
wherein the controller is further configured to:
sense a first threshold voltage of the selected memory cell;
in response to the sensed first threshold voltage being between a first pre-program verify level and a first program verify level, bias the selected memory cell to a first voltage level, wherein the first pre-program verify level is less than a final pre-program verify level and the first program verify level is less than a final program verify level; and
in response to the sensed first threshold voltage being greater than the first program verify level, inhibit programming of the selected memory cell.

2. The memory device of claim 1, wherein the controller is further configured to:
in response to the sensed first threshold voltage being less than the first pre-program verify level, bias the selected memory cell to a second voltage level less than the first voltage level; and
apply a particular program pulse to the selected memory cell.

3. The memory device of claim 1, wherein a difference between the first pre-program verify level and the first program verify level equals a difference between the final pre-program verify level and the final program verify level.

4. The memory device of claim 1, wherein a difference between the first program verify level and the final program verify level is less than or equal to 1V.

5. The memory device of claim 2, wherein the controller is further configured to:
sense a second threshold voltage of the selected memory cell;
in response to the sensed second threshold voltage being between the final pre-program verify level and the final program verify level, bias the selected memory cell to the first voltage level;
in response to the sensed second threshold voltage being less than the final pre-program verify level, bias the selected memory cell to the second voltage level; and
in response to the sensed second threshold voltage being greater than the final program verify level, inhibit further programming of the selected memory cell.

6. The memory device of claim 2, wherein the controller is further configured to:
sense a second threshold voltage of the selected memory cell;
in response to the sensed second threshold voltage being between a second pre-program verify level and a second program verify level, bias the selected memory cell to the first voltage level, wherein the second pre-program verify level is less than the final pre-program verify level and greater than the first pre-program verify level, and the second program verify level is less than the final program verify level and greater than the first program verify level.

7. The memory device of claim 6, wherein a difference between the first program verify level and the second program verify level equals a difference between the second program verify level and the final program verify level.

8. The memory device of claim 6, wherein the controller is further configured to:
in response to the sensed second threshold voltage being less than the second pre-program verify level, bias the selected memory cell to the second voltage level;
in response to the sensed second threshold voltage being greater than the second program verify level, inhibit programming of the selected memory cell; and
apply a first subsequent program pulse to the selected memory cell.

9. The memory device of claim 8, wherein the first subsequent program pulse is immediately subsequent to the particular program pulse.

10. The memory device of claim 8, wherein the controller is further configured to:
sense a third threshold voltage of the selected memory cell;
in response to the sensed third threshold voltage being between a third pre-program verify level and a third program verify level, bias the selected memory cell to the first voltage level, wherein the third pre-program verify level is less than the final pre-program verify level and greater than the second pre-program verify level, and the third program verify level is less than the final program verify level and greater than the second program verify level;

in response to the sensed third threshold voltage being less than the third pre-program verify level, bias the selected memory cell to the second voltage level;

in response to the sensed third threshold voltage being greater than the third program verify level, inhibit programming of the selected memory cell; and apply a second subsequent program pulse to the selected memory cell.

11. The memory device of claim 10, wherein the second subsequent program pulse is immediately subsequent to the first subsequent program pulse.

12. The memory device of claim 10, wherein a difference between the first program verify level and the second program verify level, a difference between the second program verify level and the third program verify level, and a difference between the third program verify level and the final program verify level are equal.

13. A memory device comprising:
an array of memory cells; and
a controller configured to access the array of memory cells to program a selected memory cell of the array of memory cells to a target level,
wherein the controller is further configured to:
sense a first threshold voltage of the selected memory cell;
in response to the sensed first threshold voltage being less than a first pre-program verify level corresponding to a first program verify level, bias the selected memory cell to a second voltage level, wherein the first pre-program verify level is less than a final pre-program verify level and the first program verify level is less than a final program verify level; and
in response to the sensed first threshold voltage being greater than the first program verify level, inhibit programming of the selected memory cell.

14. The memory device of claim 13, wherein the controller is further configured to:
in response to the sensed first threshold voltage being between the first pre-program verify level and the first program verify level, bias the selected memory cell to a first voltage level greater than the second voltage level.

15. The memory device of claim 14, wherein the controller is further configured to:
apply a particular program pulse to the selected memory cell.

16. The memory device of claim 15, wherein the controller is further configured to:
sense a second threshold voltage of the selected memory cell;

in response to the sensed second threshold voltage being between the final pre-program verify level and the final program verify level, bias the selected memory cell to the first voltage level;

in response to the sensed second threshold voltage being less than the final pre-program verify level, bias the selected memory cell to the second voltage level;

in response to the sensed second threshold voltage being greater than the final program verify level, inhibit further programming of the selected memory cell; and apply a subsequent program pulse to the selected memory cell.

17. A memory device comprising:
an array of memory cells; and
a controller configured to access the array of memory cells to program a selected memory cell of the array of memory cells to a target level,
wherein the controller is further configured to:
sense a first threshold voltage of the selected memory cell; and
in response to the sensed first threshold voltage being greater than a first program verify level corresponding to a first pre-program verify level, inhibit programming of the selected memory cell, wherein the first pre-program verify level is less than a final pre-program verify level and the first program verify level is less than a final program verify level.

18. The memory device of claim 17, wherein the controller is further configured to:
in response to the sensed first threshold voltage being between the first pre-program verify level and the first program verify level, bias the selected memory cell to a first voltage level.

19. The memory device of claim 18, wherein the controller is further configured to:
in response to the sensed first threshold voltage being less than the first pre-program verify level, bias the selected memory cell to a second voltage level less than the first voltage level; and
apply a particular program pulse to the selected memory cell.

20. The memory device of claim 19, wherein the controller is further configured to:
sense a second threshold voltage of the selected memory cell;

in response to the sensed second threshold voltage being between the final pre-program verify level and the final program verify level, bias the selected memory cell to the first voltage level;

in response to the sensed second threshold voltage being less than the final pre-program verify level, bias the selected memory cell to the second voltage level;

in response to the sensed second threshold voltage being greater than the final program verify level, inhibit further programming of the selected memory cell; and apply a subsequent program pulse to the selected memory cell.

* * * * *